United States Patent [19]

Saito

[11] Patent Number: 5,283,445
[45] Date of Patent: Feb. 1, 1994

[54] QUANTUM SEMICONDUCTOR DEVICE EMPLOYING QUANTUM BOXES FOR ENABLING COMPACT SIZE AND HIGH-SPEED OPERATION

[75] Inventor: Miyoshi Saito, Kawasaki, Japan

[73] Assignee: Fujitsu Limited, Kanagawa, Japan

[21] Appl. No.: 981,152

[22] Filed: Nov. 24, 1992

[30] Foreign Application Priority Data

Nov. 29, 1991 [JP] Japan .................. 3-316850
Jun. 19, 1992 [JP] Japan .................. 4-161442

[51] Int. Cl.⁵ .............. H01L 29/06; H01L 29/80; H01L 27/26
[52] U.S. Cl. .............. 257/24; 257/20; 257/27; 257/197
[58] Field of Search .............. 257/15, 20, 23–27, 257/197

[56] References Cited

U.S. PATENT DOCUMENTS

| | | | |
|---|---|---|---|
| 4,575,924 | 3/1986 | Reed et al. | 437/105 |
| 4,581,621 | 4/1986 | Reed | 257/20 |
| 4,796,068 | 1/1989 | Katayama et al. | 257/20 |
| 4,872,038 | 10/1989 | Bernstein et al. | 257/20 |
| 4,912,531 | 3/1990 | Reed et al. | 257/17 |
| 4,969,018 | 11/1990 | Reed | 257/25 |
| 5,070,375 | 12/1991 | Sakai | 257/189 |
| 5,170,226 | 12/1992 | Fukuzawa et al. | 257/22 |
| 5,198,879 | 3/1993 | Ohshima | 257/20 |

FOREIGN PATENT DOCUMENTS

| | | | |
|---|---|---|---|
| 0170044 | 2/1986 | European Pat. Off. | |
| 61-81662 | 4/1986 | Japan | |
| 61-82470 | 4/1986 | Japan | |
| 61-82471 | 4/1986 | Japan | |
| 61-82472 | 4/1986 | Japan | |
| 61-82473 | 4/1986 | Japan | |
| 61-94375 | 5/1986 | Japan | 257/15 |
| 61-123174 | 6/1986 | Japan | |
| 63-170 | 1/1988 | Japan | 257/20 |
| 1-208871 | 8/1989 | Japan | 257/14 |
| 2-148741 | 6/1990 | Japan | 257/20 |

*Primary Examiner*—William Mintel
*Assistant Examiner*—Mahshid Saadat
*Attorney, Agent, or Firm*—Nikaido, Marmelstein, Murray & Oram

[57] ABSTRACT

A quantum semiconductor device has a semiconductor substrate, a plurality of quantum boxes formed adjacent to one another in the semiconductor substrate, and a quantum level control unit for changing the effective size of at least one of the quantum boxes, to thereby change the quantum level of each of the quantum boxes. Consequently, according to the present invention, an influence of charges due to peripheral impurities is small, and thereby a compact quantum semiconductor device can be provided. Further, according to the present invention, a highly integrated high-speed switching circuit can be provided.

9 Claims, 30 Drawing Sheets

Fig.16

| | f1 | f2 | OUTPUT |
|---|---|---|---|
| ① ⇨ | 0 | 0 | 0 |
| ② ⇨ | 0 | 1 | 0 |
| ③ ⇨ | 1 | 0 | 0 |
| ④ ⇨ | 1 | 1 | 1 |

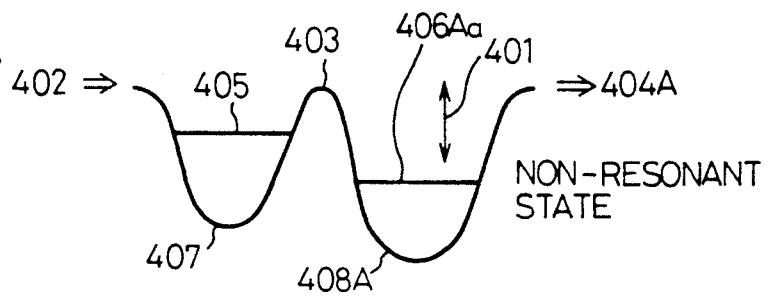
Fig.19A — NON-RESONANT STATE
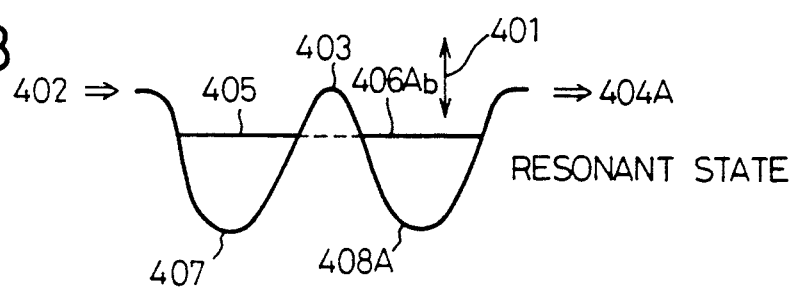
Fig.19B — RESONANT STATE
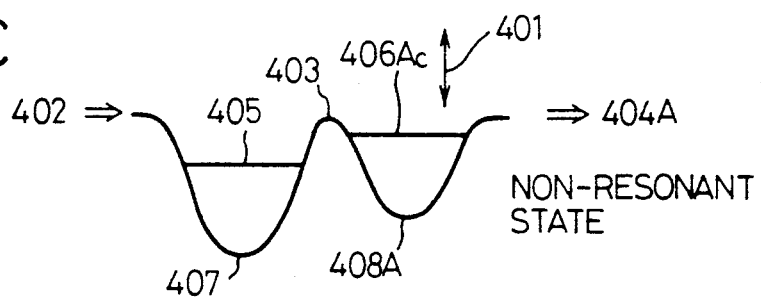
Fig.19C — NON-RESONANT STATE
Fig.19D
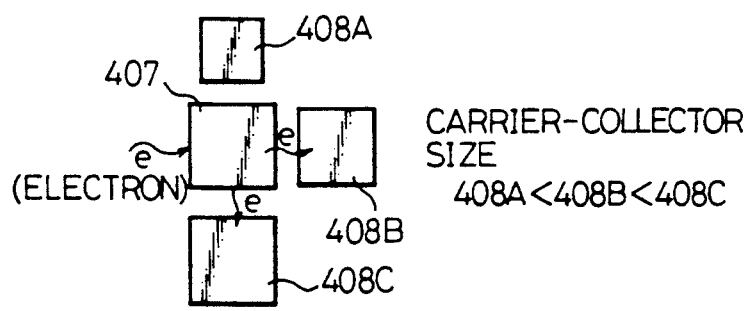
CARRIER-COLLECTOR SIZE
408A < 408B < 408C Fig.21A  Fig.21B
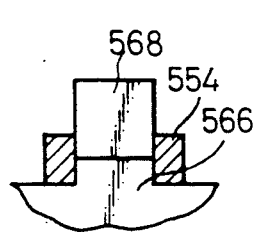
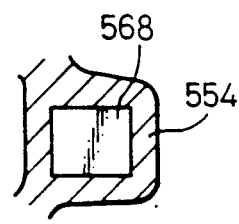
Fig.22A
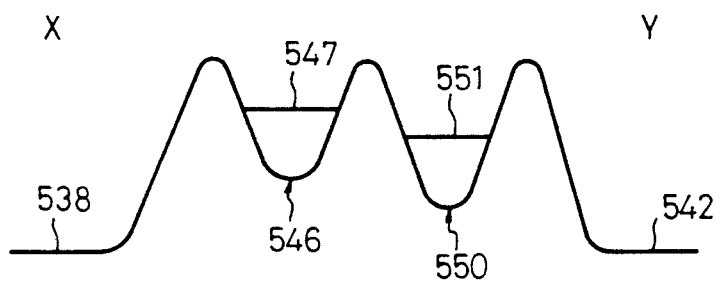
Fig.22B
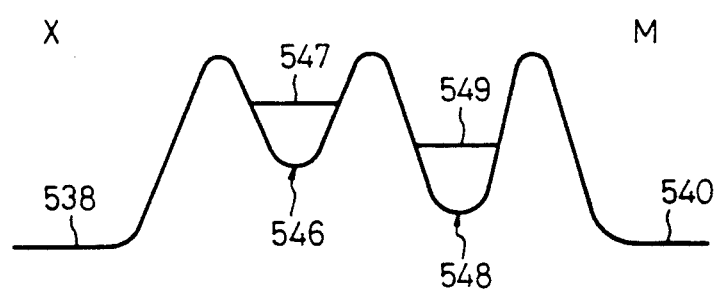
Fig.22C
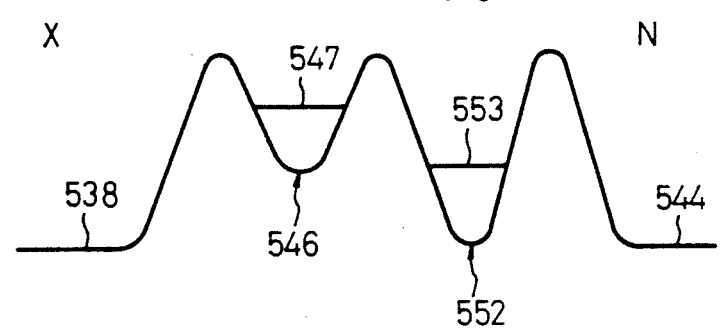

Fig. 30

| | INPUT | | OUTPUT | | | |
|---|---|---|---|---|---|---|
| | F1 | F2 | OUT1 | OUT2 | OUT3 | OUT4 |
| Ⓥ ⇨ | 0 | 0 | 1 | 0 | 0 | 0 |
| Ⓥ Ⅰ ⇨ | 0 | 1 | 0 | 1 | 0 | 0 |
| Ⓥ Ⅱ ⇨ | 1 | 0 | 0 | 0 | 1 | 0 |
| Ⓥ Ⅲ ⇨ | 1 | 1 | 0 | 0 | 0 | 1 |

QUANTUM SEMICONDUCTOR DEVICE EMPLOYING QUANTUM BOXES FOR ENABLING COMPACT SIZE AND HIGH-SPEED OPERATION

BACKGROUND OF THE INVENTION

1. Field of the Invention

The present invention relates to a semiconductor device, more particularly, to a quantum semiconductor device employing a plurality of quantum boxes whose degree of freedom of carriers is zero-dimensional.

2. Description of the Related Art

In recent years, advancements in fine semiconductor processing technology and fine structure growing technology have realized the processing of submicron semiconductor regions. In such a fine region, electrons demonstrate quantum mechanical characteristics and their energy levels are quantized. Namely, highly advanced fine semiconductor processing technology is capable of fabricating semiconductor devices on the order of submicrons. In a very fine semiconductor region on the order of a de Broglie wave of an electron in a solid, carriers demonstrate quantum mechanical characteristics, and the energy levels of electrons and positive holes are quantized.

A quantum well layer having the degree of freedom of two dimensions, a quantum thin line (or quantum wire) having a degree of freedom of one dimension, and a quantum box having a degree of freedom of zero dimensions achieve a quantized state that is different from one achieved by three-dimensional particles. Positively utilizing such a quantized state may realize a functional element that provides new functions.

One of the new functions achieved by use of the quantized levels is a resonant tunneling phenomenon. In this resonant tunneling phenomenon, carriers are selectively transferred between adjacent regions by tunneling only when two adjacent energy levels coincide with each other. A resonant hot electron transistor (RHET) with its emitter using the resonance phenomenon has been experimentally fabricated.

Note, quantum semiconductor devices may employ not only two-dimensional regions formed from the quantum well layers explained above but also one- or zero-dimensional regions. For example, Mark A. Reed and Robert T. Bate have proposed quantum semiconductor devices employing a pair of zero-dimensional regions and utilizing an energy resonant phenomenon between the regions (Japanese Unexamined Patent Publication (Kokai) Nos. 61-81662, 61-82470, 61-82471, 61-82472, 61-82473, and 61-123174).

SUMMARY OF THE INVENTION

It is an object of the present invention to provide a quantum semiconductor device having a novel arrangement. Further, it is another object of the present invention to provide a quantum semiconductor device employing quantum boxes that can be densely integrated. In addition it is still another object of the invention is to provide a quantum semiconductor device employing a modulation dope structure.

According to the present invention, there is provided a quantum semiconductor device comprising a semiconductor substrate, a plurality of quantum boxes formed adjacent to one another in the semiconductor substrate, and a quantum level control unit for changing the effective size of at least one of the quantum boxes to control the quantum level thereof.

The quantum boxes may comprise a modulation dope structure, which includes a channel layer of low impurity concentration and narrow band gap, and an electron supply layer of high impurity concentration and wide band gap formed close to the channel layer. The modulation dope structure may be formed by using a molecular beam epitaxy method or metal organic chemical vapor deposition. The channel layer may be made of intrinsic type gallium arsenide, and the electron supply layer may be made of n+channel type aluminium gallium arsenide.

The quantum semiconductor device may further comprise an electron supply unit disposed adjacent to one of the quantum boxes for supplying electrons, and an electron collection unit disposed adjacent to the other of the quantum boxes for collecting electrons. At least one of the electron supply unit and the electron collection unit may include a quantum thin line. At least one of the electron supply unit and the electron collection unit may include a quantum well layer. The quantum semiconductor device may further comprise a high-resistance region surrounding at least two of the quantum boxes.

The quantum level control unit may include one Schottky electrode connected to at least one of the quantum boxes. The number of quantum boxes may be determined to two, and the Schottky electrode may be connected to one of the quantum boxes. The number of quantum boxes may be determined to be three, and the Schottky electrode may be connected to two of the quantum boxes. The number of quantum boxes may be determined to be four, and the Schottky electrode may be connected to three of the quantum boxes.

The quantum level control unit may include a plurality of Schottky electrodes connected to the quantum boxes. The number of quantum boxes may be determined to two, the number of Schottky electrodes may be determined to be two, and each of the two Schottky electrodes may be connected to corresponding one of the two quantum boxes, respectively. The number of quantum boxes may be determined to be three, the number of Schottky electrodes may be determined to be two, and each of the two Schottky electrodes may be connected to corresponding one of the three quantum boxes, respectively.

Further, according to the present invention, there is also provided a quantum semiconductor device comprising a semiconductor substrate, a carrier emitter having a quantum box structure formed in the semiconductor substrate, a plurality of carrier collectors each having a quantum box structure formed in the semiconductor substrate, so that carriers tunnel from the carrier emitter to the carrier collectors, and a control unit for controlling the sizes of the carrier collectors by an external voltage.

The quantum semiconductor device may further comprise a source unit having a quantum well structure or thin line quantum structure for supplying carriers to the carrier emitter, and a plurality of drain units each having a quantum well structure or thin line quantum structure for receiving carriers from the carrier collectors. The source unit, the carrier emitter, the carrier collectors, and drain unit may be formed in a two-dimensional electron gas region produced by a heterojunction modulation dope.

The carrier collectors may be formed by quantum boxes of different sizes, the control unit may have an external voltage applying unit for applying the same external voltage to the carrier collectors, and the carrier emitter may separately provide carriers, by resonant tunneling, to the carrier collectors in response to the external voltage.

The carrier collectors may be formed by quantum boxes of different sizes, and the control unit may include one Schottky electrode connected to all of the number of carrier collectors. The carrier collectors may be determined to be three, and the Schottky, electrode may be connected to the three number of carrier collectors. The carrier correctors may be determined to be two, and the Schottky electrode may be connected to the two carrier collectors.

The control unit may include a plurality of Schottky electrodes each connected to a corresponding one of the carrier collectors. The number of carrier collectors may be determined to be two, and each of the Schottky electrodes may be connected to a corresponding one of the two carrier collectors. A plurality of the quantum semiconductor devices may be combined to constitute a decoder.

BRIEF DESCRIPTION OF THE DRAWINGS

The present invention will be more clearly understood from the description of the preferred embodiments as set forth below with reference to the accompanying drawings, wherein:

FIG. 16 is a diagram showing a table of the operations shown in FIGS. 15A to 15D;

FIGS. 19A, 19B, and 19C are diagrams for explaining a basic configuration of a quantum semiconductor device according to the present invention;

FIG. 19D is a schematic plan diagram showing a basic configuration of the basic configuration of the quantum semiconductor device according to the present invention;

FIG. 21A is a sectional diagram showing a modified Schottky gate electrode of the quantum semiconductor device shown in FIGS. 20A and 20B;

FIG. 21B is a plan diagram of the modified Schottky gate electrode of the quantum semiconductor device of FIG. 21A;

FIGS. 22A, 22B, 22C and 23A, 23B, 23C are diagrams for explaining a basic configuration of a quantum semiconductor device according to the present invention;

FIG. 30 is a diagram showing a table of the operations of the decoder shown in FIG. 29.

DESCRIPTION OF THE PREFERRED EMBODIMENTS

First, an example of a quantum semiconductor device according to the prior art will be explained, with reference to FIGS. 1A to 1C.

Figure 1A:
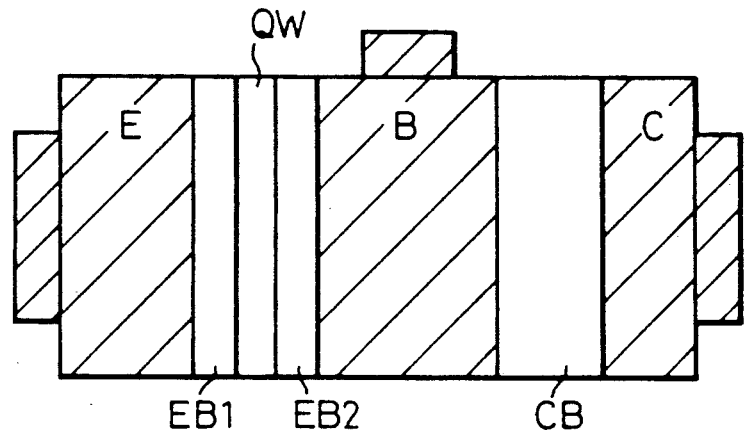
FIGS. 1A, 1B, and 1C are schematic diagrams for explaining an RHET according to the prior art.
Figure 1B:
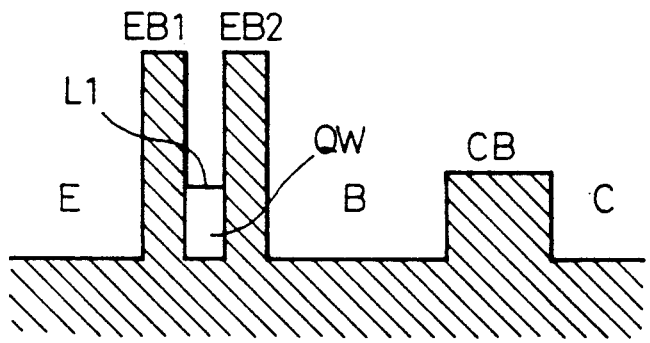
Figure 1C:
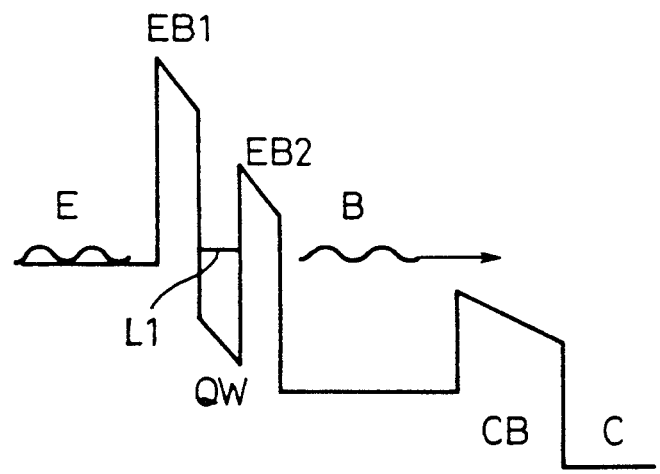

FIGS. 1A, 1B, and 1C are schematic diagrams for explaining an RHET (resonance hot electron transistor) as an example of a semiconductor device that utilizes quantized electrons according to the prior art. FIG. 1A schematically shows an arrangement of the RHET, FIG. 1B shows a band structure of the RHET, and FIG. 1C shows a band structure of the RHET in an active state.

In FIG. 1A, an emitter region E and a base region B are each made of gallium arsenide (GaAs), and a superlattice (EB1, QW, EB2) is disposed between the emitter region E and base region B. The superlattice comprises a quantum well layer QW made of GaAs, which is sandwiched between a pair of emitter barrier regions EB1 and EB2 each made of aluminium gallium arsenide (AlGaAs) having a wide band gap. Note, the quantum well layer QW may or may not be doped. On the other side of the base region B, there are disposed a collector barrier region CB made of AlGaAs having a narrower band gap than that of the emitter barrier region (EB1, EB2), and a collector region C made of GaAs. The emitter region E, base region B, and collector region C are provided with electrodes, respectively, to control the potential thereof.

FIG. 1B shows a band structure at the bottom of a conduction band of the above structure shown in FIG. 1A. The emitter region E, quantum well layer QW, base region B, and collector region C are each made of GaAs so that the bottom of the conduction band of each of them substantially shows the same energy. On the other hand, the emitter barrier regions EB1 and EB2 are each made of AlGaAs having a wide band gap, so that energy at the bottom of the conduction band is high to form potential barriers with respect to the GaAs regions (E, QW, B, C). The collector barrier region CB is made of AlGaAs whose band gap is narrower than any one of those of the emitter barriers (EB1, EB2) and wider than any one of those of the GaAs regions, and therefore, provides intermediate energy at the bottom of the conduction band.

When a gap between the emitter barrier regions EB1 and EB2 is reduced, electron energy of the quantum well layer QW disposed between the emitter barrier regions is quantized to a level of, for example, L1. In this state, electrons at the bottom of the conduction band of the emitter region E must tunnel through the emitter barrier region EB1, quantum well layer QW, and emitter barrier region EB2, to reach the base region B.

FIG. 1C shows a band structure with proper bias voltages being applied to the emitter region E, base region B, and collector region C. By adjusting the bias voltages applied to the emitter region E and base region B, the energy level L1 allowed in the quantum well layer QW will be equalized to electron energy in the emitter region E. In this state, electrons in the emitter region E can reach the quantum well layer QW, if they are able to tunnel through the emitter barrier region EB1. Further, electrons in the quantum well layer QW can reach the base region B if they are able to tunnel through the emitter barrier region EB2. Consequently, the potential barriers that must be tunneled through by electrons become thin, and electrons in the emitter region E can travel to the base region B through the potential barriers.

Note, in this state, electrons in the base region B are set in a hot electron state having high energy, so that these electrons may reach the collector region C if they can pass through the potential barrier formed by the collector barrier region CB. Further, the potential barrier made by the collector barrier region CB prevents a base-collector current from flowing when a bias voltage is applied to the base region B. In this way, the electron supplying region and electron collecting region formed on each side of the electron energy quantized region provide a semiconductor device that utilizes a resonant phenomenon.

In the above descriptions, when the emitter-base voltage is changed, electron energy in the emitter region resonates with an energy level in the quantum well layer QW, to increase a current. If the bias voltage is further increased, the resonating state disappears, the current decreases, and negative resistance appears. Note, when a plurality of quantized levels are used, a plurality of peaks appear on I-V characteristics.

Note, quantum semiconductor devices may employ not only two-dimensional regions formed from the quantum well layers explained above but also one- or zero-dimensional regions. For example, Mark A. Reed and Robert T. Bate proposed quantum semiconductor devices employing a pair of zero-dimensional regions and utilizing an energy resonant phenomenon between the regions (Japanese Unexamined Patent Publication (Kokai) Nos. 61-81662, 61-82470, 61-82471, 61-82472, 61-82473, and 61-123174).

The quantum semiconductor devices described above externally modulate regions including potential wells, to produce a resonant phenomenon with a quantized level. Accordingly, an electric field for controlling operation of the quantum semiconductor device spreads over a relatively wide area. This prevents the quantum semiconductor elements from being disposed adjacent to one another.

Next, the principle of a quantum semiconductor device according to the present invention will be explained.

Figure 2A:
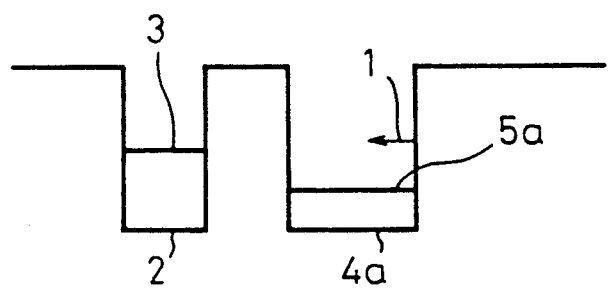
FIGS. 2A, 2B, 2C and 3A, 3B, 3C are diagrams for explaining a principle of a quantum semiconductor device according to the present invention.
Figure 2B:
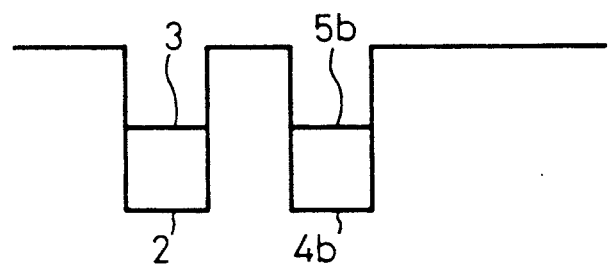
Figure 2C:
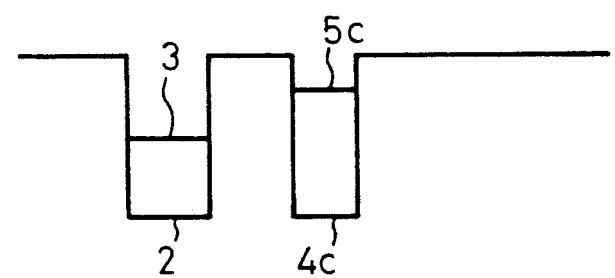

FIGS. 2A, 2B, and 2C are diagrams for explaining a principle of a quantum semiconductor device according to the present invention.

As shown in FIG. 2A, which shows two quantum boxes 2 and 4a having different sizes, the inside of the quantum box 2 forms a quantum level 3, and the inside of the quantum box 4a forms a quantum level 5a. For the sake of explanation, the quantum boxes 2 and 4a have the same depth. Further, the quantum level 3 in the quantum box 2 is higher than the quantum level 5a in the quantum box 4a in terms of energy level. The size of the quantum box 4a is gradually reduced without changing the depth thereof, as indicated with an arrow mark 1.

When the size of the quantum box 4a is reduced, the quantum level 5a in the box gradually increases its energy level. Namely, as shown in FIG. 2B, when the size of the quantum box 4a is reduced to 4b, the quantum level 5a is increased to an energy level 5b that is equal to the quantum level 3, as a result of reduction in the size of the quantum box 4a. Since the quantum levels 3 and 5b are equal to each other, the quantum boxes 2 and 4b cause a resonant phenomenon. Further, as shown in FIG. 2C, when the size of the quantum box 4b is further reduced to 4c shown in FIG. 2C, a quantum level 5c in the box will be higher than the quantum level 3 in the quantum box 2. In this state, the resonance (resonant phenomenon) disappears.

As described above, by reducing the physical size of a quantum box with the potential depth of the box being unchanged gradually increases a quantum level in the box, so that the physical size is increased, or the quantum level drops. Note, a pair of quantum boxes are prepared with a quantum level in one of the quantum boxes being lower than that in the other. When the physical size of the one quantum box is gradually reduced, the quantum level thereof gradually increases, and when the quantum level becomes equal to that in the other quantum box, a resonant phenomenon occurs.

On the other hand, when the physical size of the other quantum box is gradually increased, the quantum level thereof gradually decreases, and when it becomes equal to the quantum level of the one quantum box, the resonant phenomenon occurs.

Figure 3A:
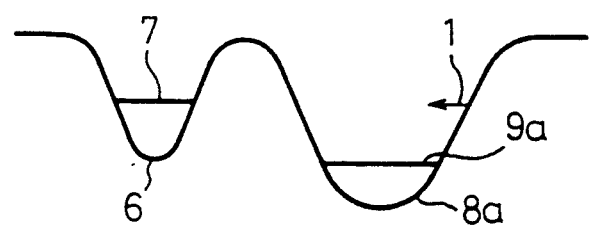
Figure 3B:
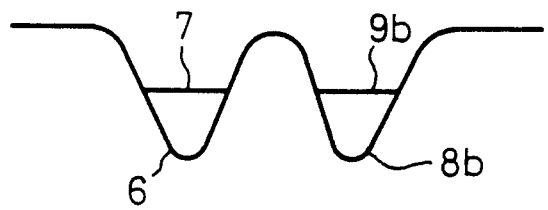
Figure 3C:
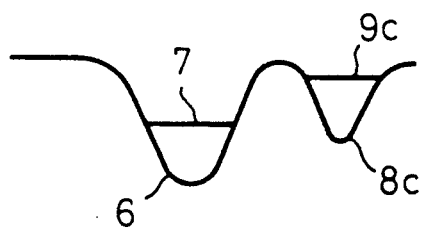

FIGS. 3A, 3B, and 3C are diagrams for explaining a principle of a quantum semiconductor device according to the present invention. Note, when the size of a quantum box is small, or when the quantum semiconductor device employing a quantum box is small, a steep potential change such as one shown in FIGS. 2A, 2B, and 2C will hardly occur but with the change being gentler. Further, when a depletion layer in a semiconductor is used to define a non-depletion region, a potential distribution in the depletion layer hardly causes a steep potential change. FIG. 3A, 3B, and 3C show quantum boxes defined by such a gradually changing potential distribution.

As shown in FIG. 3A, which shows two quantum boxes 6 and 8a, the inside of the quantum box 6 provides a quantum level 7, and the inside of the quantum box 8a provides a quantum level 9a. The physical size of the quantum box 8a is larger than that of the quantum box 6, and the quantum level 9a in the quantum box 8a is lower than the quantum level 7 in the quantum box 6 in terms of energy level.

In FIG. 3A, the size of the quantum box 8a is gradually reduced as indicated with an arrow mark 1. As shown in FIG. 3B, when the size of the quantum box 8a is gradually reduced to 8b, which is nearly equal to the size of the quantum box 6, the quantum levels 7 and 9b become almost equal to each other in terms of energy level. In this state, the quantum boxes 6 and 8b cause a resonant phenomenon. When the quantum box 8a is made smaller as indicated with the arrow mark 1, the energy at the bottom of the quantum box 8a gradually rises. As shown in FIG. 3C, when the size of the quantum box 8b is further reduced to 8c, a quantum level 9c in the box will be higher than the quantum level 7 in the quantum box 6. In this state, the resonant phenomenon disappears.

In FIGS. 2A, 2B, and 2C, the size of a quantum box is reduced without changing the potential depth thereof. On the other hand, in FIGS. 3A, 3B and 3C, the size of a quantum box is reduced with the potential thereof being changed accordingly.

It is practically very difficult to reduce only the size of a quantum box without changing the potential depth thereof as shown in FIGS. 2A, 2B, and 2C. An actually occurring state, therefore, will be an intermediate state between FIGS. 2A, 2B, 2C and FIGS. 3A, 3B, 3C, or the state of FIGS. 3A, 3B, and 3C.

Such a state may be realized by modulation dope structure used for, for example, a high electron mobility transistor (HEMT). A semiconductor of high impurity concentration and wide energy gap is laminated over a semiconductor of low impurity concentration and narrow energy gap, to form the modulation dope structure. A two-dimensional electron gas structure is produced on the surface of the semiconductor of low impurity concentration and narrow energy gap. This two-dimensional electron gas structure is under a two-dimensional quantum state. Surrounding the two-dimensional electron gas structure with a depletion layer may provide a one- or zero-dimensional quantum state. Such a zero-dimensional state may be used to change the size of a quantum box such as one shown in FIGS. 2A, 2B, 2C and 3A, 3B, 3C, to thereby control a resonant state without forming a potential gradient outside the quantum box.

Below, the preferred embodiments of a quantum semiconductor device according to the present invention will be explained.

Figure 4A:
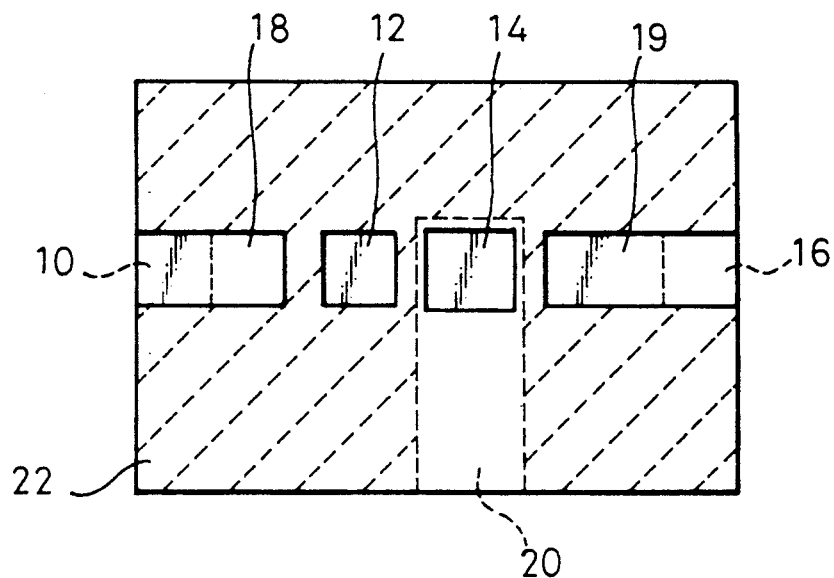
FIG. 4A is a plan diagram showing a first embodiment of a quantum semiconductor device according to the present invention.
Figure 4B:
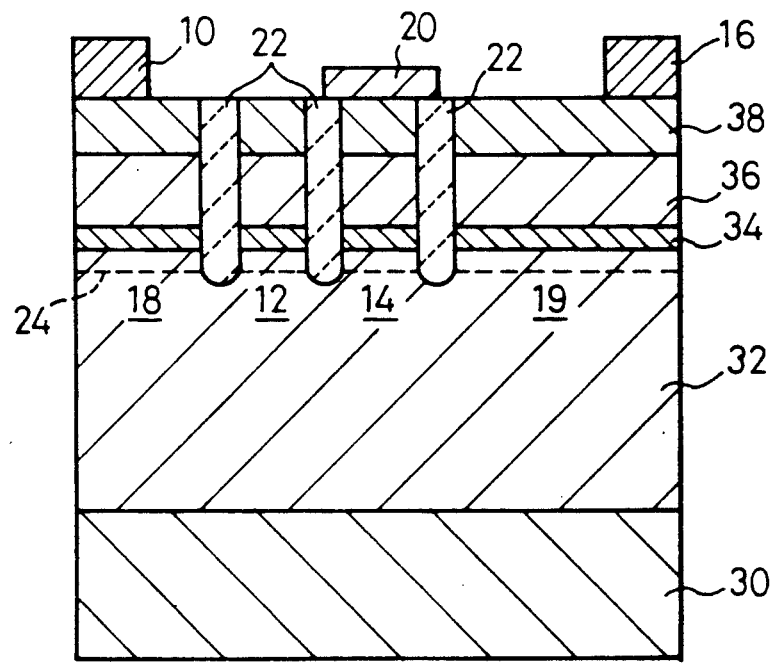
FIG. 4B is a sectional diagram of the first embodiment shown in FIGS. 4A and 4B.

FIGS. 4A and 4B show a first embodiment of a quantum semiconductor device according to the present invention. Namely, FIG. 4A is a plan diagram, and FIG. 4B is a schematic sectional diagram of the first embodiment.

In FIGS. 4A and 4B, a semi-intrinsic (si-) type GaAs substrate 30 carries an intrinsic (i-) type GaAs channel layer 32 of about 500 nm thick, an i-type AlGaAs spacer layer 34 of about 10 nm thick, an n-channel type (n-type) AlGaAs electron supply layer 36 of 45 nm thick, and an n+-type GaAs contact layer 38 of 45 nm thick, and these layers are formed by using, for example, a molecular beam epitaxy (MBE) method or metal organic chemical vapor deposition (MOCVD) method. The GaAs channel layer 32 and n-type AlGaAs electron supply layer 36 form a modulation dope structure, to produce, on the surface of the GaAs channel layer 32, a two-dimensional electron gas layer 24 of about $2.3 \times 10^{11}$ cm$^{-2}$ in sheet carrier concentration and about 800,000 cm$^2$/Vx in mobility. When the electron supply layer is sufficiently thick, carriers will be induced on the surface of the channel layer with no contact layer.

A high-resistance region 22 is formed by ion beams or convergent ion beams, from the surface to the depth below the two-dimensional electron gas layer 24. As shown in FIG. 4A, the high-resistance region 22 is formed in a region excluding channel regions 18 and 19 each demonstrating a one-dimensional quantum state and zero-dimensional regions 12 and 14 each demonstrating a zero-dimensional quantum state. The zero-dimensional regions 12 and 14 form quantum boxes, and the channel regions 18 and 19 form quantum thin lines. The effective size of each quantum box is, for example, about 100 to 200 angstroms (Å) in the length of one side.

On the n+-type GaAs contact layer 38, a source electrode 10 and a drain electrode 16 are formed from AuGe/Au (for example, 20 nm/200 nm) by a lift-off method, to provide ohmic contacts. On the n+-GaAs contact layer 38 above the zero-dimensional region 14, a gate electrode 20 is formed from an aluminium (Al) layer of about 300 nm thick, to provide a Schottky contact. The ohmic contact electrodes 10 and 16 form alloys with the semiconductor device below, and the alloyed regions reach the two-dimensional electron gas layer 24. As a result, the source electrode 10 is ohmically connected to the one-dimensional channel 18, and the drain electrode 16 is ohmically connected to the one-dimensional channel 19.

The gate electrode 20 modulates the potential of the zero-dimensional region 14 in response to an applied voltage, to control the width of a depletion layer formed around the quantum box. As the width of the depletion layer is modulated, the size of the quantum box is changed, thereby modulating a quantum level allowed in the quantum box. When the quantum levels of the zero-dimensional regions 12 and 14 become equal to each other in terms of energy level, a resonant tunneling phenomenon occurs.

A Schottky contact and another gate electrode may be provided above the zero-dimensional region 12, to modulate the size of the zero-dimensional region 12. When the quantum levels of the zero-dimensional regions 12 and 14 are both controlled, tunneling conditions may be set more freely. In this case, however, the two electrodes for controlling the potential of the two zero-dimensional regions 12 and 14 must be insulated from each other and separately controlled.

Note, the above described quantum semiconductor device can be formed by using production methods for forming a high electron mobility transistor (HEMT) such as an MBE method, MOCVD method, and the like.

Operations of the quantum semiconductor device of FIGS. 4A and 4B will be explained with reference to FIGS. 5A to 5D and 6.

Figure 5A:
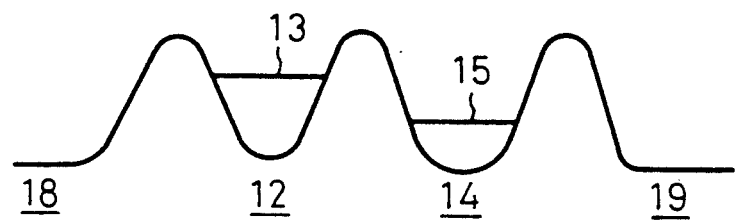
FIGS. 5A, 5B, 5C, and 5D are schematic diagrams for explaining operations of the first embodiment shown in FIGS. 4A and 4B.

FIGS. 5A, 5B, 5C, and 5D show potential distributions along a channel for transporting electrons, and FIG. 5A shows a potential distribution with no bias voltage applied to the electrodes.

The one-dimensional channel 18 and zero-dimensional region 12 are located adjacent to each other with a potential barrier being disposed between them, the zero-dimensional regions 12 and 14 are located adjacent to each other with a potential barrier being disposed between them, and the zero-dimensional region 14 and one- dimensional channel 19 are located adjacent to each other with a potential barrier being disposed between them.

The area of the zero-dimensional region 14 is wider than that of the zero-dimensional region 12. A quantum level 13 in the zero-dimensional region 12 is higher than a quantum level 14 in the zero-dimensional region 14 in terms of energy level. Electron energy in each of the one-dimensional channels 18 and 19 is at the bottom of the potential shown. This condition is basically unchanged even if quantum levels rise due to quantization.

Figure 5B:
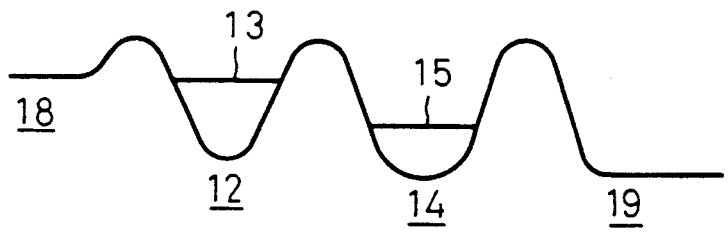
Figure 5C:
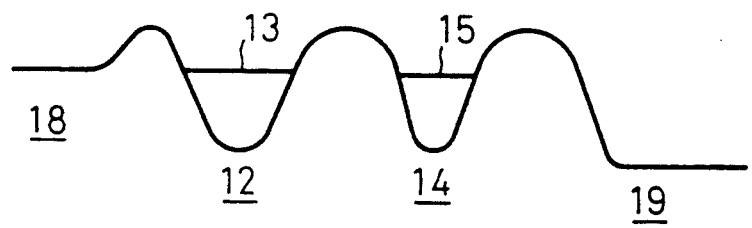

First, as shown in FIG. 5B, a voltage is applied to the source electrode 10 to increase the potential of the one-dimensional channel 18 up to the quantum level 13 in the zero-dimensional region 12. Next, as shown in FIG. 5C, a voltage is applied to the Schottky gate electrode 20 to control the width of the zero-dimensional region 14, so that the quantum level 15 will be equal to the quantum level 13. In this example, the width of the zero-dimensional region 14 is narrowed to increase the quantum level 15 up to the quantum level 13. The quantum levels 13 and 15 are substantially equal to each other in terms of energy level, and therefore, the zero-dimensional regions 12 and 14 cause a resonant phenomenon.

In this state, electrons in the source region 18 tunnel through the potential barrier toward the zero-dimensional region 12. The electrons further tunnel through the next potential barrier toward the zero-dimensional region 14. Furthermore, electrons in the zero-dimensional region 14 tunnel through another potential barrier toward the drain region 19, thereby producing a drain current.

Figure 5D:
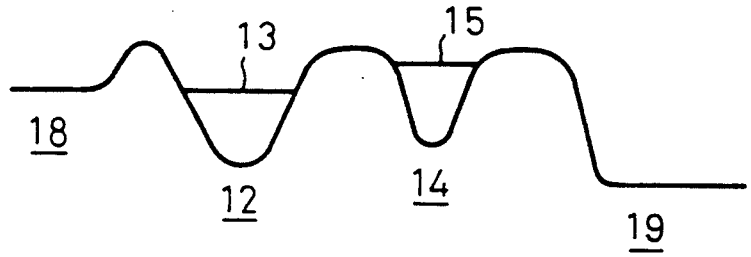

As shown in FIG. 5D, when the voltage applied to the Schottky gate electrode 20 is changed to further reduce the size of the zero-dimensional region 14, the quantum level 15 becomes higher than the quantum level 13, so that the resonant state disappears. At this time, electrons at the quantum level 13 in the zero-dimensional region 12 are unable to move toward the quantum level 15 in the zero-dimensional region 14. Consequently, a current does not flow from the source region 18 toward the drain region 19.

Figure 6:
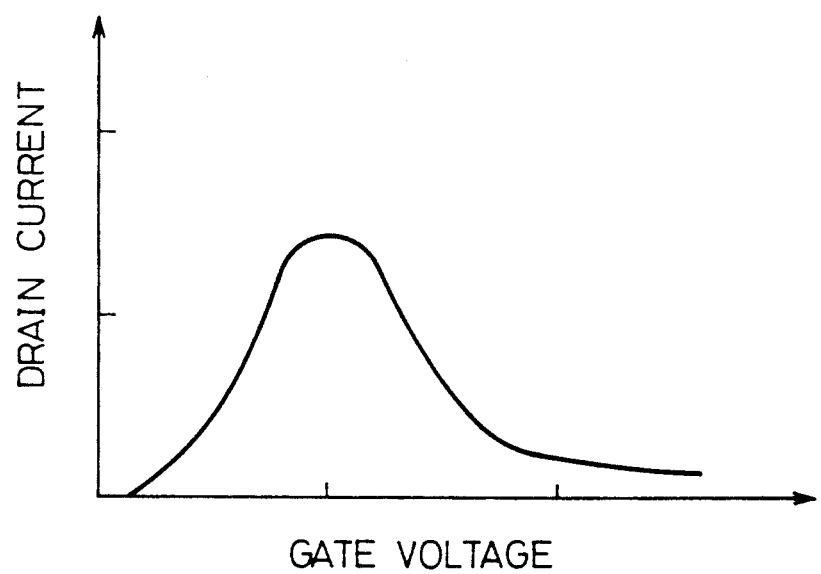
FIG. 6 is a diagram showing I-V characteristics of the first embodiment shown in FIGS. 4A and 4B.

FIG. 6 shows I–V characteristics of the first embodiment shown in FIGS. 4A and 4B, that is, FIG. 6 shows changes in the drain current and changes in the gate voltage applied to the Schottky gate electrode 20. An increase in the gate voltage causes a resonant tunneling phenomenon, which disappears afterwards. The drain current then reaches a peak, and negative resistance is produced.

As described above, the two one-dimensional channels 18 and 19 are linearly disposed on each side of the two zero-dimensional regions 12 and 14. These channels 18 and 19 may be two- or zero-dimensional channels. Instead of the linear arrangement, other arrangements may be adopted. Note, the case where the channels (18, 19) are constituted by two-dimensional channels (quantum well layer) will be explained later with reference to FIG. 18 (sixth embodiment of the present invention).

The Schottky gate electrode serving as means for changing the effective size of a quantum box may be replaced with another means. For example, an insulation gate electrode may be employed.

Figure 7A:
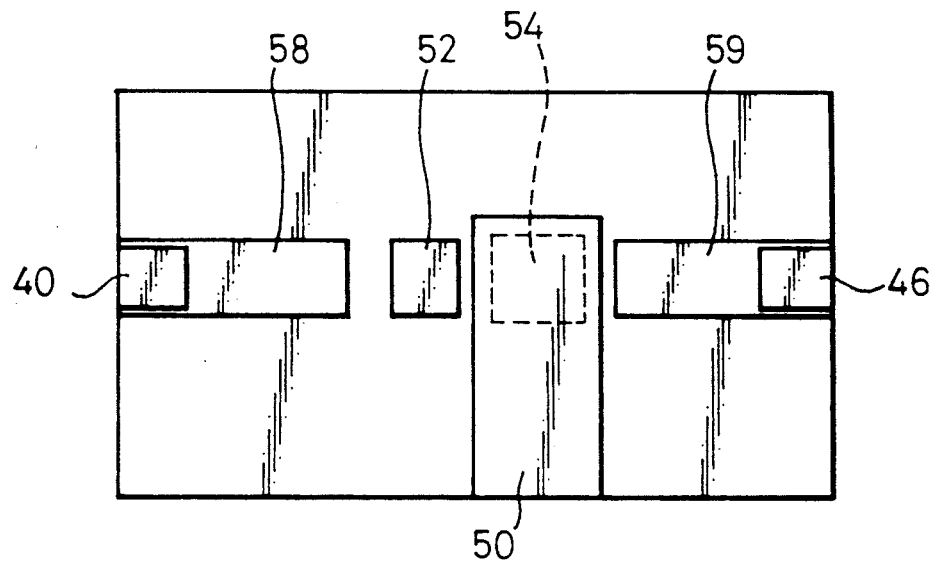
FIG. 7A is a plan diagram showing a second embodiment of a quantum semiconductor device according to the present invention.
Figure 7B:
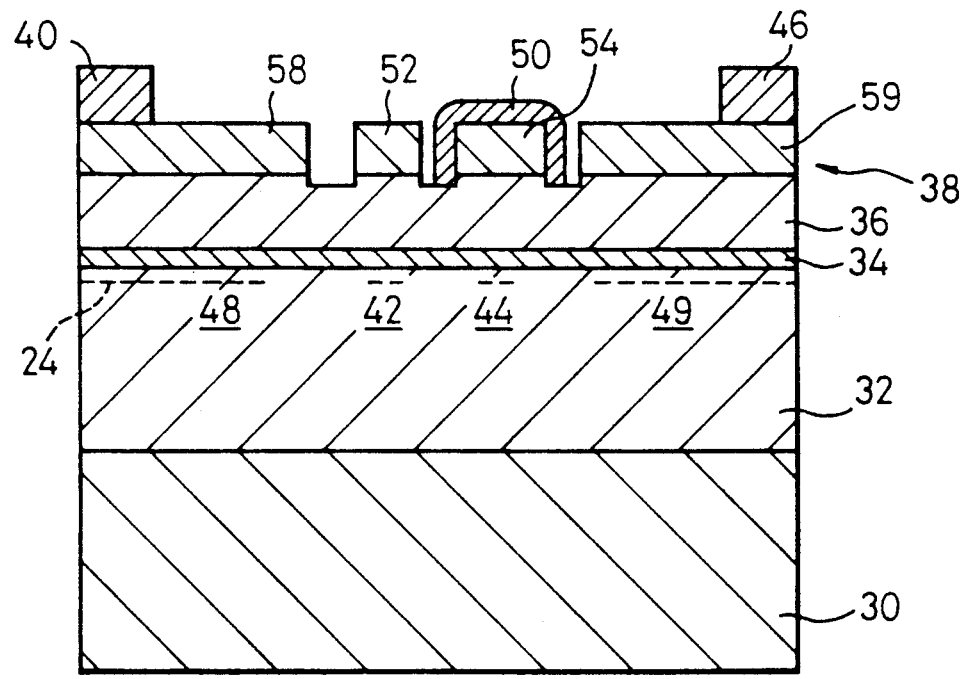
FIG. 7B is a sectional diagram of the second embodiment shown in FIG. 7A.

FIGS. 7A and 7B show a second embodiment of a quantum semiconductor device according to the present invention. FIG. 7A is a plan diagram, and FIG. 7B is a schematic sectional diagram of the second embodiment.

In FIGS. 7A and 7B, a si-type (semi-intrinsic type) GaAs substrate 30 bears an i-type (intrinsic type) GaAs channel layer 32 of about 500 nm thick, an i-type AlGaAs spacer layer 34 of about 10 nm thick, an n-type AlGaAs electron supply layer 36 of about $1 \times 10^{18}$ cm$^{-3}$ in impurity concentration and about 45 nm thick, and an n$^+$-type GaAs contact layer 38 of about $1 \times 10^{18}$ cm$^{-3}$ in impurity concentration and about 45 nm thick, the layers being epitaxially formed by, for example, an MBE method or MOCVD method. The n$^+$-type GaAs contact layer 38 is patterned as shown in FIG. 7A by photolithography. The patterned n$^+$-type GaAs contact layer 38 is located over regions 58 and 59 under which one-dimensional channels 48 and 49 are formed, and over regions 52 and 54 under which zero-dimensional regions 42 and 44 are formed.

A depletion-type HEMT structure is formed in a region above which the n$^+$-type GaAs contact layer 38 is located, and a two-dimensional electron gas layer 24 is produced on the surface of the i-type GaAs channel layer 32. Note, when the electron supply layer is sufficiently thick, a two-dimensional electron gas is produced irrespective of the contact layer. To restrain the two-dimensional electron gas in one or zero dimensions, it is preferable to selectively thin the electron supply layer except active parts thereof. Further, on the contact layers 58 and 59, a source electrode 40 and a drain electrode 46 are formed, respectively, from AuGe/Au (for example, 20 nm/200 nm) by a lift-off method, to provide ohmic contacts.

The source electrode 40 and drain electrode 46 that provide the ohmic contacts make alloys with the semiconductor device arranged under them. The alloy regions reach the two-dimensional electron gas layer 24. As a result, the one-dimensional channels 48 and 49 are ohmically connected to the source electrode 40 and drain electrode 46, respectively. The GaAs channel layer 32 and n-type AlGaAs electron supply layer 36 form a modulation dope structure to produce the two-dimensional electron gas layer 24 of about $2.3 \times 10^{11}$ $cm^{-2}$ in sheet carrier concentration and 800,000 $cm^2/Vs$ in mobility.

An energy level on the surface of the channel layer 32 excluding the parts corresponding to the $n^+$-type GaAs contact layers 52, 54, 58, and 59 is high to deplete and produce no two-dimensional electron gas. The sizes of the $n^+$-type GaAs contact layers 52, 54, 58, and 59 are so selected to provide zero-dimensional regions 42 and 44 under the contact layers 52 and 54, and one-dimensional channels 48 and 49 under the contact layers 58 and 59.

A gate electrode 50 for providing a Schottky contact is disposed around the surface of the $n^+$-type GaAs contact layer 54. The gate electrode 50 is in direct contact with the electron supply layer 36 around the contact layer 54. A voltage applied to the Schottky gate electrode 50 is controlled to control a depletion layer around the zero-dimensional region 44, thereby controlling the size of the zero-dimensional region 44. In addition to the gate electrode 50, another independent gate electrode may be arranged on the surface of the $n^+$-type GaAs contact layer 52 above the zero-dimensional region 42.

According to this second embodiment, the gate electrode 50 is in direct contact with the surface of the electron supply layer 36 around the zero-dimensional region 44, and with the $n^+$-type GaAs contact layer 54 above the zero-dimensional region 44. Consequently, an influence of the voltage applied to the gate electrode 50 on the channel layer 32 is stronger at the periphery of the zero-dimensional region 44 than at the center of the zero-dimensional region 44. Accordingly, a depletion layer is easily grown around the zero-dimensional region 44, and therefore, the size of the zero-dimensional region 44 is easily controlled without largely changing an energy level at the potential bottom of the zero-dimensional region 44.

Compared with the first embodiment of FIGS. 4A and 4B, in the second embodiment of FIGS. 7A and 7B, the response against the voltage change is drastic. In addition, quantum level intervals in the quantum box formed by the zero-dimensional region 44 can be widened to easily prevent a dullness of quantum level caused by various diffusions.

Figure 8A:
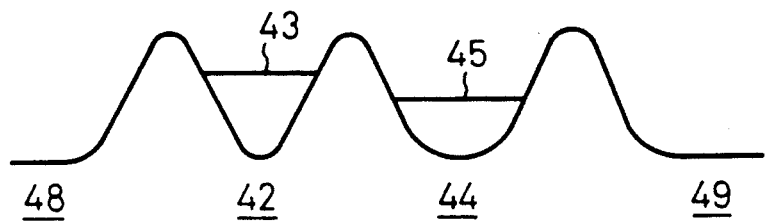
FIGS. 8A, 8B, 8C, and 8D are schematic diagrams for explaining operations of the second embodiment shown in FIGS. 7A and 7B.

Operations of the second embodiment of FIGS. 7A and 7B will be explained with reference to FIGS. 8A to 8D and 9. FIG. 8A shows a potential distribution with no bias voltage. The one-dimensional channel 48, zero-dimensional region 42, zero-dimensional region 44, and one-dimensional channel 49 are lined up with potential barriers being disposed between them.

The width of the zero-dimensional region 44 is wider than that of the zero-dimensional region 42. A quantum level 45 in the zero-dimensional region 44 is lower than a quantum level 43 in the zero-dimensional region 42 in terms of energy level.

Figure 8B:
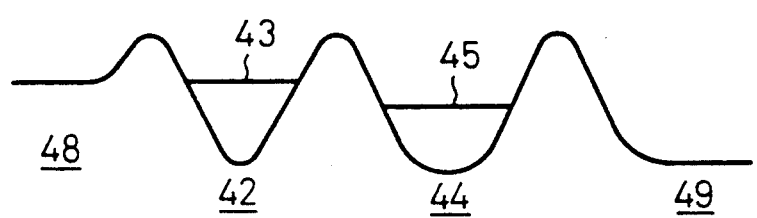

As shown in FIG. 8B, at first, a voltage is applied to the source electrode 40 to control the potential of the one-dimensional channel 48 connected to the source electrode 40 until the potential becomes equal to the quantum level 43 in the zero-dimensional region 42. In this state, electrons in the one-dimensional channel 48 can tunnel through the potential barrier toward the zero-dimensional region 43. It is, however, impossible for electrons to move from the zero-dimensional region 42 to the zero-dimensional region 44 because the quantum level 43 in the zero-dimensional region 42 is different from the quantum level 45 in the zero-dimensional region 44.

Figure 8C:
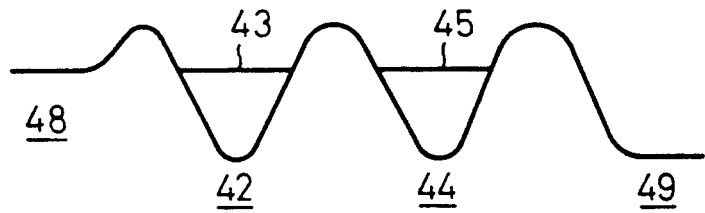

Next, a voltage is applied to the gate electrode 50 to control the size of the zero-dimensional region 44 disposed under the gate electrode 50. Namely, an inverse bias voltage is applied to the gate electrode 50 to grow a depletion layer around the zero-dimensional region 44 to reduce the size of the remaining zero-dimensional region 44. As the size of the zero-dimensional region 44 decreases, the quantum level 45 therein gradually rises. As shown in FIG. 8C, when the quantum level 45 becomes nearly equal to the quantum level 43, the zero-dimensional regions 42 and 44 cause a resonant phenomenon through the potential barrier between them. In this state, electrons tunnel from the one-dimensional channel 48 to the zero-dimensional region 42 through the corresponding potential barrier, to the zero-dimensional region 44 through the next potential barrier, and to the one-dimensional channel 49 through the last potential barrier. As a result, a current flows from the source electrode to the drain electrode.

Figure 8D:
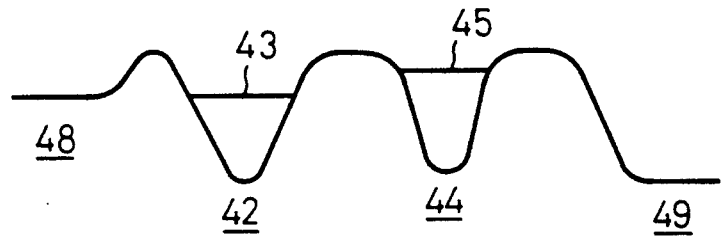

If the inverse bias voltage applied to the gate electrode 50 is further increased, the size of the zero-dimensional region 44 is further reduced to further increase the quantum level 45. As shown in FIG. 8D, when the quantum level 45 becomes higher than the quantum level 43 by a certain extent, the resonant state disappears. Thereafter, electrons are unable to move from the zero-dimensional region 42 to the zero-dimensional region 44. In this state, a current does not flow from the source electrode toward the drain electrode.

Figure 9:
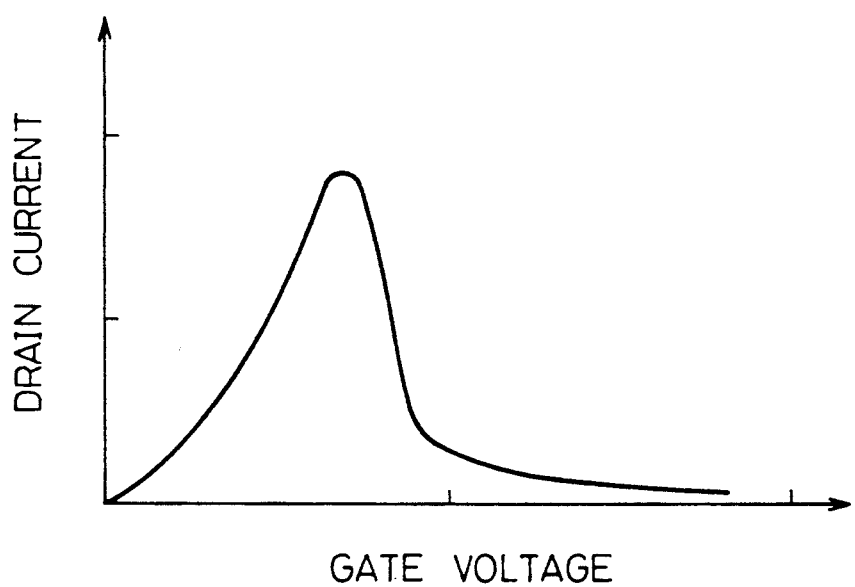
FIG. 9 is a diagram showing I-V characteristics of the second embodiment shown in FIGS. 7A and 7B.

FIG. 9 shows I-V characteristics of the second embodiment shown in FIGS. 7A and 7B. Negative resistance is produced by the resonant tunneling phenomenon. Since the size of the quantum box is more easily controlled by the gate voltage, a peak and a valley of the drain current are more acute and the resonant tunneling phenomenon appears more clearly, compared with the I-V characteristics of FIG. 6.

Since a quantum level is controlled by changing the size of a zero-dimensional region, the periphery of the quantum box is less influenced. This realizes higher integration in a semiconductor device. The embodiment explained above employs one-dimensional channels. The means for supplying electrons to a zero-dimensional region and the means for collecting electrons from a zero-dimensional region may be two- or zero-dimensional channels.

Figure 10A:
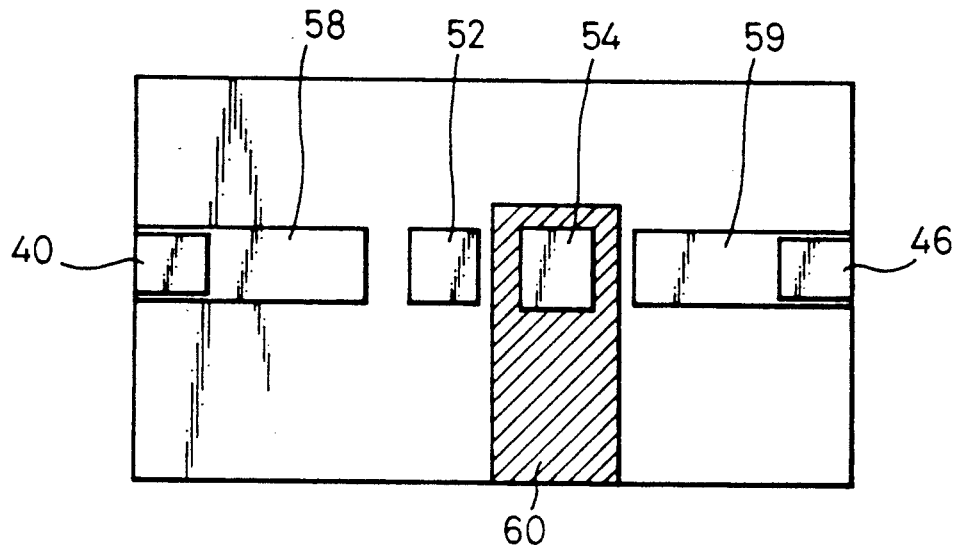
FIG. 10A is a plan diagram showing a third embodiment of a quantum semiconductor device according to the present invention.
Figure 10B:
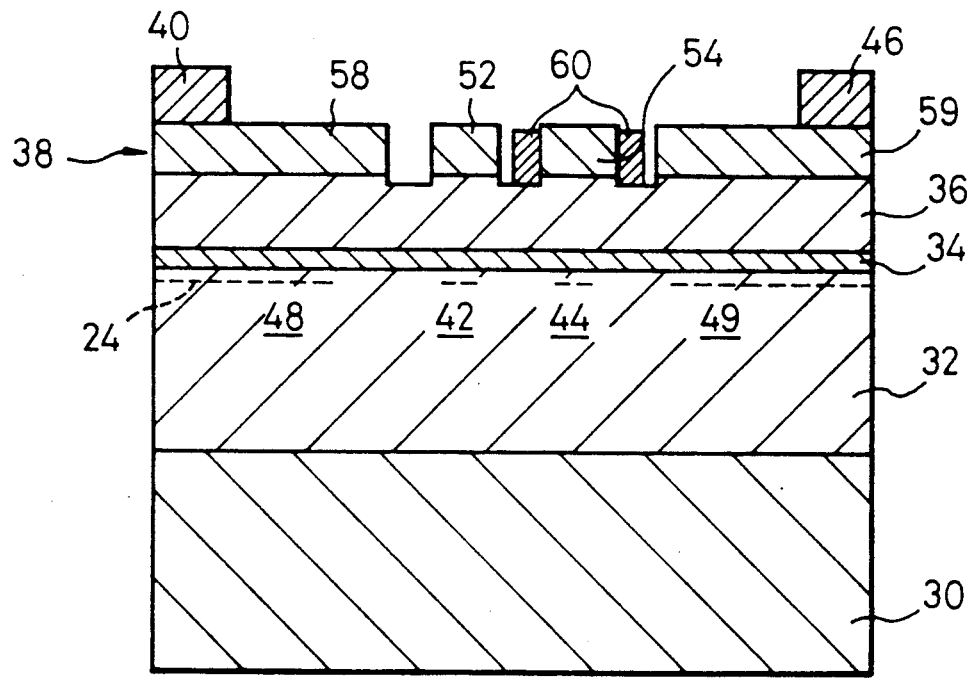
FIG. 10B is a sectional diagram of the third embodiment shown in FIG. 10A.
Figure 10C:
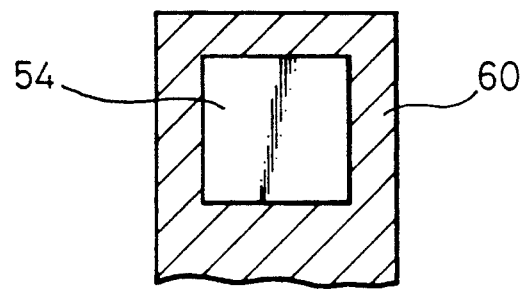
FIGS. 10C and 10D are sectional diagrams showing parts of the quantum semiconductor device of FIGS. 10A and 10B.
Figure 10D:
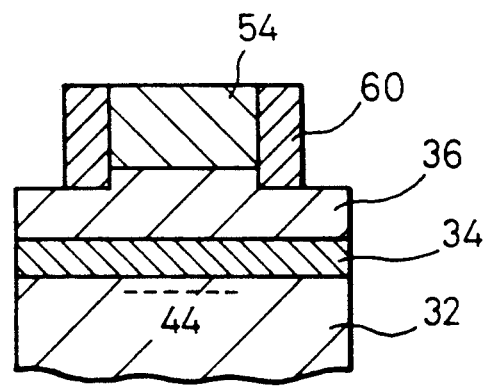

FIGS. 10A, 10B, 10C, and 10D show a third embodiment of a quantum semiconductor device according to the present invention. Namely, FIG. 10A is a sectional diagram, FIG. 10B is a plan diagram, FIG. 10C is an enlarged diagram showing a gate electrode portion, and FIG. 10D is an enlarged section showing the gate electrode portion.

In FIG. 10A, a si-type GaAs substrate 30 bears an i-type GaAs channel layer 32 of 500 nm thick, an i-type AlGaAs spacer layer 34 of about 10 nm thick, an n-type AlGaAs electron supply layer 36 of about $1 \times 10^{18}$ $cm^{-3}$ in impurity concentration and about 45 nm thick, and an $n^+$-type GaAs contact layer 38 of about 45 nm thick, the layers being formed by, for example, an MBE method or MOCVD method.

As shown in FIG. 10B, the $n^+$-type GaAs contact layer 38 is patterned to form fine spot-like regions 52 and 54 for forming zero-dimensional regions, and linear regions 58 and 59 disposed beside the regions 52 and 54. On the linear contact layers 58 and 59, there are formed a source electrode 40 and a drain electrode 46 from AuGe/Au (for example 20 nm/200 nm). Similar to the second embodiment of FIGS. 7A and 7B, the contact layer is not always required.

This structure of the third embodiment is similar to that of the second embodiment shown in FIGS. 7A and 7B. According to this third embodiment, an aluminum (Al) Schottky gate electrode 60 is formed on the electron supply layer 36, to surround the spot-like contact layer 54. Unlike the second embodiment of FIGS. 7A and 7B, this third embodiment does not form the gate electrode 60 over the contact layer 54. FIGS. 10C and 10D show enlarged diagrams of the gate electrode 60.

Similar to the former embodiments, the source electrode 40 and drain electrode 46 form alloys with the semiconductor device disposed below them, and the alloys reach a two-dimensional electron gas layer 24. The channel layer 32 and electron supply layer 36 form a modulation dope structure to provide the two-dimensional electron gas layer 24 of about $2.3 \times 10^{11}$ cm$^{31\ 2}$ in sheet carrier concentration and 800,000 cm$^2$/Vs in mobility, similar to the previous embodiments. Regions excluding the contact layers 52, 54, 58, and 59 do not produce the two-dimensional electron gas layer 24 on the surface of the channel layer 32. This also resembles to the previous embodiments.

In this way, as shown in FIG. 10A, zero-dimensional regions 42 and 44 are formed under the fine contact layers 52 and 54, and one-dimensional channels 48 and 49 under the linear contact layers 58 and 59.

According to this third embodiment, the gate electrode 60 is formed only around the fine contact layer 54 but not over the top thereof, so that a depletion layer that is produced when an inverse bias voltage is applied to the gate electrode 60 grows from the vicinity of the zero-dimensional region 44 at first. As a result, a shrinking speed of the potential depth of the zero-dimensional region 44 in response to the inverse bias voltage applied to the gate electrode 60 becomes slower than that of the second embodiment of FIGS. 7A and 7B. Accordingly, a reduction in the lateral size of a potential distribution of this embodiment is more conspicuous.

Operations of the third embodiment of FIGS. 10A, 10B, 10C, and 10D will be explained with reference to FIGS. 11A to 11D and 12.

Figure 11A:
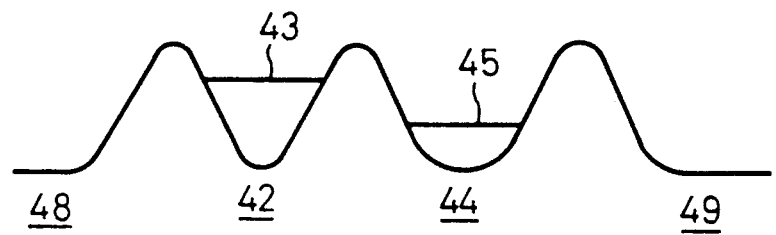
FIGS. 11A, 11B, 11C, and 11D are schematic diagrams for explaining operations of the third embodiment shown in FIGS. 10A and 10B.

FIG. 11A shows a potential distribution with no voltage being applied to any electrode. The bottoms of potential of the one-dimensional regions 48 and 49 and zero-dimensional regions 42 and 44 are substantially identical to one another. The size of the zero-dimensional region 44 is larger than that of the zero-dimensional region 42, and a quantum level 43 in the zero-dimensional region 42 is higher than a quantum level 45 in the zero-dimensional region 44.

Figure 11B:
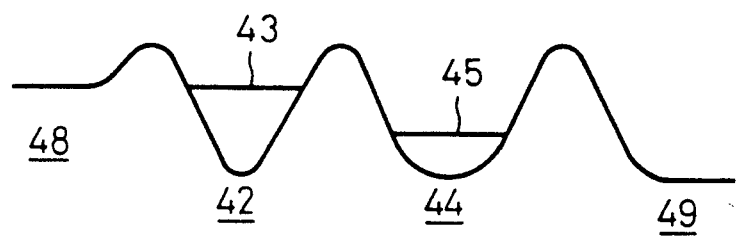

As shown in FIG. 11B, at first, a voltage is applied to the source electrode 40 to increase the potential of the one-dimensional region 48 connected to the source electrode 40 so that it becomes equal to the quantum level 43 in the zero-dimensional region 42 in terms of energy level. In this state, electrons can tunnel from the one-dimensional region 48 to the zero-dimensional region 42. However, they cannot tunnel from the zero-dimensional region 42 to the zero-dimensional region 44 because these zero-dimensional regions have different quantum levels.

Figure 11C:
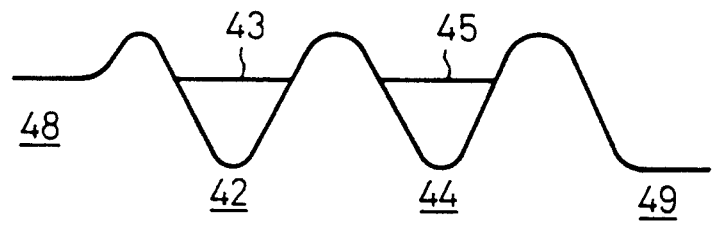
Figure 11D:
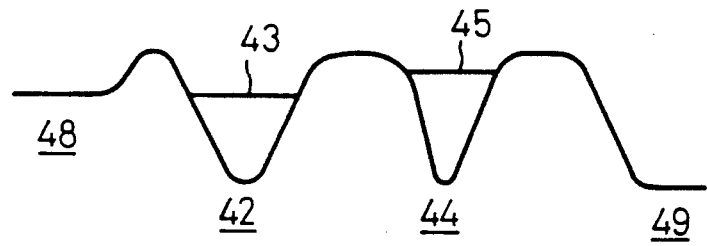

Next, an inverse bias voltage is applied to the gate electrode 60 to expand a depletion layer around the zero-dimensional region 44. As the depletion layer expands, the size of the zero-dimensional region 44 becomes smaller to gradually raise the quantum level 45 in the region. When the quantum level 45 becomes nearly equal to the quantum level 43 of the zero-dimensional region 42, a resonant tunneling phenomenon occurs. Namely, as shown in FIG. 11C, electrons at the quantum level 43 in the zero-dimensional region 42 are able to tunnel through an intermediate potential barrier toward the quantum level 45 of the zero-dimensional region 44. Further, electrons in the one-dimensional region 48 can move to the quantum level 43 at the same energy level of the zero-dimensional region 42 by tunneling, and then to the quantum level 45 of the zero-dimensional region 44 by tunneling. Further, electrons at the quantum level 45 in the zero-dimensional region 44 are able to move to the one-dimensional region 49 by tunneling. As a result, a drain current flows.

As shown in FIG. 11, when the inverse bias voltage applied to the gate electrode 60 is further increased, the depletion layer around the zero-dimensional region 44 expands widely, to further increase the quantum level 45 in the zero-dimensional region 44. Since the quantum level 45 shifts to a higher energy level than the quantum level 43, electrons cannot move from the zero-dimensional region 42 to the zero-dimensional region 44 by tunneling. As a result, the drain current drops.

Figure 12:
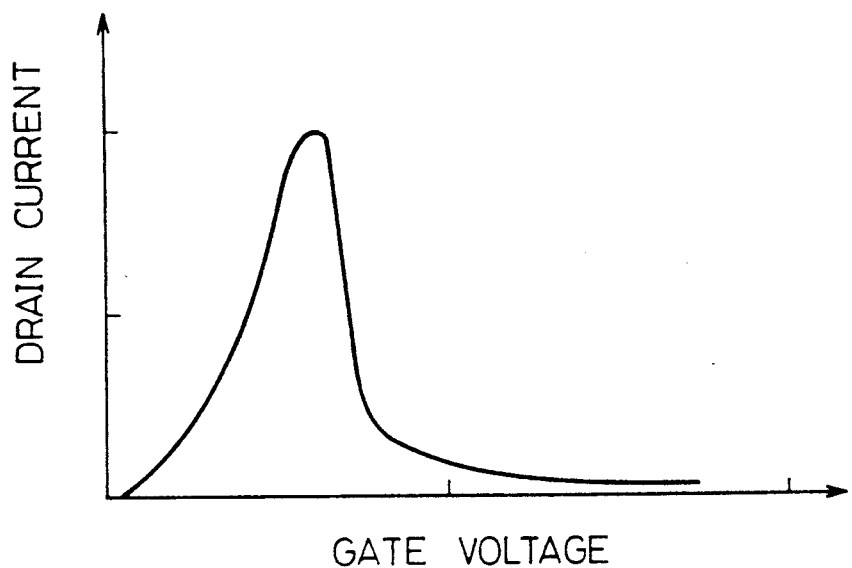
FIG. 12 is a diagram showing I-V characteristics of the third embodiment shown in FIGS. 10A and 10B.

FIG. 12 shows I-V characteristics of the third embodiment shown in FIGS. 10A and 10B. According to this third embodiment, the gate electrode 60 is not formed over the top of the fine contact layer 54, so that a decreasing speed of potential depth at the center of the zero-dimensional region 44 is slower than the second embodiment of FIGS. 7A and 7B.

This third embodiment grows a depletion layer sidewards to more conspicuously reduce the size of a zero-dimensional region, thereby enabling the response against the voltage change to be drastic, widening quantum level intervals in a quantum box, and preventing a dullness of quantum level caused by various diffusions. Accordingly, the shapes of a peak and a valley on the I-V characteristics of FIG. 12 are more acute than those on the I-V characteristics of FIG. 9. Note, a Schottky contact and another gate electrode may be provided above the zero-dimensional region 52, to modulate the size of the zero-dimensional region 52, which will be explained after with reference to FIGS. 14A, 14B, 15A to 15D, 16, and 17 (fifth embodiment of the present invention).

In the above described first, second, and third embodiments, a modulation dope structure made of AlGaAs/GaAs may be made of combinations of other materials such as InAlAs/InGaAs. The means for supplying carriers to a zero-dimensional region and the means for collecting carriers from a zero-dimensional region are not necessarily the one-dimensional channels. The shape of a zero-dimensional region can be modified in various ways. Further, these embodiments change a quantum level in a zero-dimensional region by controlling the effective size of the zero-dimensional region, and therefore, a change in the quantum level caused by a gate electrode is more conspicuous than that caused by the technique that employs the same gate electrode but arranging one- and zero-dimensional quantum regions in a potential gradient. The third embodiment, therefore, is able to control a resonant tunneling phenomenon by a smaller gate electrode, thereby improving integration of a quantum device using the resonant tunneling phenomenon.

Figure 13:
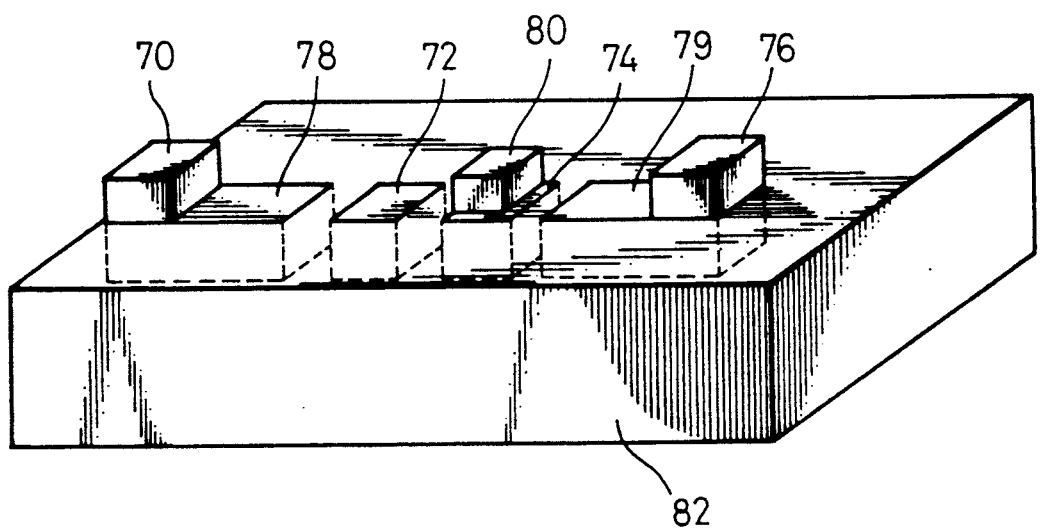
FIG. 13 is a perspective diagram showing a fourth embodiment of a quantum semiconductor device according to the present invention.

FIG. 13 shows a fourth embodiment of a quantum semiconductor device according to the present invention.

As shown in FIG. 13, an n-type GaAs region 82 bears quantum boxes 72 and 74 made of i-type GaAs and one-dimensional channels 78 and 79. The one-dimensional channels 78 and 79 form ohmic contacts with a source electrode 70 and a drain electrode 76, respectively, made of AuGe/Au (for example 20 nm/200 nm in thickness). The quantum box 74 beside a collector is Schottky-connected to a gate electrode 80 made of Al. The gate electrode may be provided not only for the quantum box 74 serving as a zero-dimensional region but also for the quantum box 72.

The n-type AlGaAs region 82 forms potential barriers under the one-dimensional channels 78 and 79 and under the quantum boxes 72 and 74. Gaps between the one-dimensional channel 78, quantum box 72, quantum box 74, and one-dimensional channel 79 are set to let carriers tunnel through them. These gaps may be vacuum or air gaps, or may be filled with semiconductor materials such as AlGaAs having a wider band gap than that of GaAs. The gate electrode 80 is smaller than the top face of the quantum box 74, so that potential around the quantum box 74 is not easily changed compared with potential at the center of the quantum box 74. This reduces the influence of the potential of the quantum box 74 on the periphery.

When an inverse bias voltage is applied to the gate electrode 80, a depletion layer produced at an interface between the gate electrode 80 and the quantum box 74 expands to reduce the effective volume of the quantum box 74 and raise a quantum level in the quantum box 74. Unlike the previous embodiments that control the horizontal width of a quantum box by depletion layer, this embodiment controls the vertical thickness of a quantum box by depletion layer. When a quantum level in the quantum box 74 is equalized with a quantum level in the quantum box 72, resonance tunneling occurs.

According to this fourth embodiment, predetermined voltages are applied to the source electrode 70, gate electrode 80, and drain electrode 76, respectively, to produce a current that flows from the source electrode 70 toward the drain electrode 76. Since the resonant tunneling phenomenon occurring between the quantum boxes 72 and 74 is utilized, negative resistance appears on I-V characteristics.

In the fourth embodiment, the quantum boxes 72 and 74 are each cubic. The shape of each quantum box may be rectangular parallelepiped, regular tetrahedron, a sphere, or any other shape. Any quantum box is acceptable if it can form a zero-dimensional region and if its effective volume is changeable in response to a voltage applied to a gate electrode. Quantum boxes and one-dimensional channels may be arranged freely. In place of one-dimensional channels, two-dimensional channels or other arrangements may be employed.

Figure 14A:
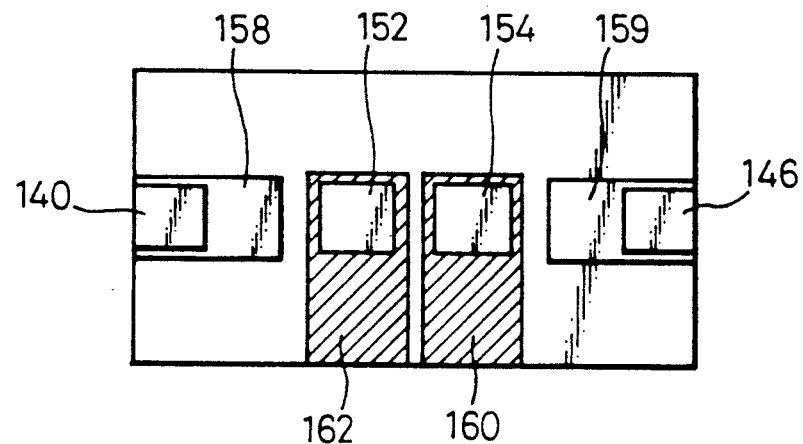
FIG. 14A is a plan diagram showing a fifth embodiment of a quantum semiconductor device according to the present invention.
Figure 14B:
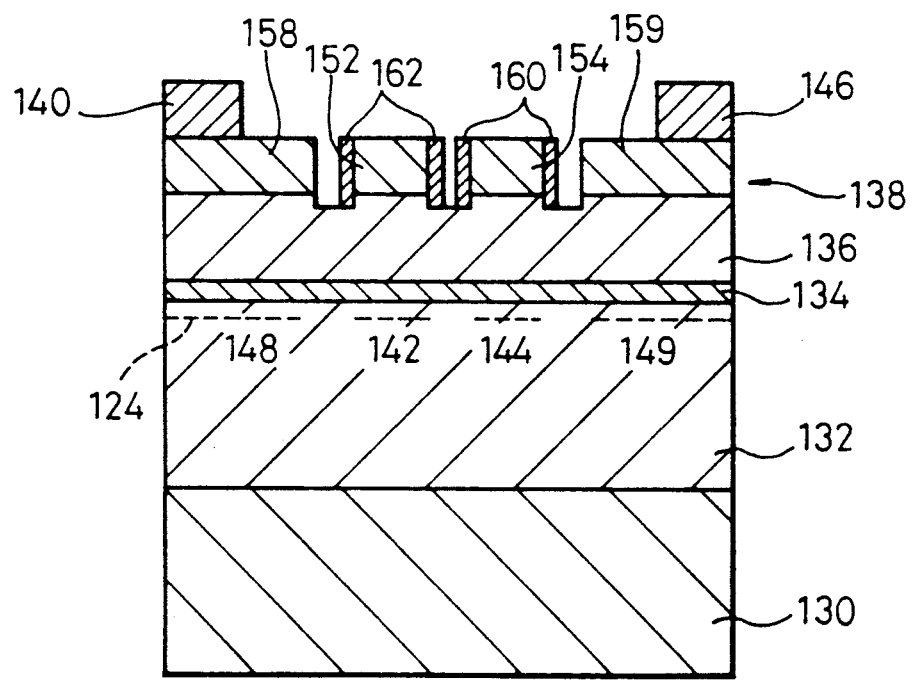
FIG. 14B is a sectional diagram of the fifth embodiment shown in FIG. 14A.

FIGS. 14A and 14B show a fifth embodiment of a quantum semiconductor device according to the present invention. By comparing this fifth embodiment with the third embodiment shown in FIGS. 10A to 10D, in the fifth embodiment of FIGS. 14A and 14B, a Schottky gate electrode 162 is additionally formed on the electron supply layer 136, to surround the spot-like contact layer 152. The other configurations of the fifth embodiment are the same as that of the third embodiment. Namely, reference numerals 124, 130, 132, 134, ..., 158, 159, and 160 shown in FIGS. 14A and 14B denote the same portions 24, 30, 32, 34, ..., 58, 59, and 60 shown in FIGS. 10A and 10B.

As described above, in this fifth embodiment shown in FIGS. 14A and 14B, two aluminum Schottky gate electrodes 160 and 162 are formed on the electron supply layer 136, to surround the spot-like contact layers 154 and 152, respectively. Note, in this fifth embodiment shown in FIGS. 14A and 14B, different signals (voltages) are independently applied to the aluminum Schottky gate electrodes 160 and 162.

Operations of the fifth embodiment of FIGS. 14A and 14B will be explained with reference to FIGS. 15A to 15D, 16, and 17.

FIGS. 15A, 15B, 15C, and 15D are schematic diagrams for explaining operations of the fifth embodiment shown in FIGS. 14A and 14B.

Figure 15A:
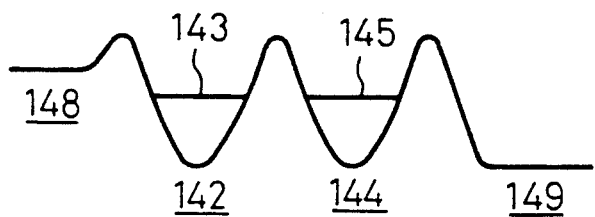
FIGS. 15A, 15B, 15C, and 15D are schematic diagrams for explaining operations of the fifth embodiment shown in FIGS. 14A and 14B.

FIG. 15A shows a potential distribution with no voltage being applied to any electrode. The bottoms of potential of zero-dimensional regions (quantum boxes) 142 and 144 are substantially identical, a specific high voltage is applied to a source electrode 140, and a specific low voltage is applied to a drain electrode 149.

Figure 15B:
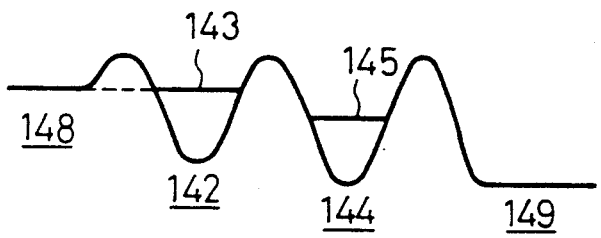

As shown in FIG. 15B, at first, an inverse bias voltage is applied to a gate electrode 162 to expand a depletion layer around the zero-dimensional region 142. As the depletion layer expands, the size of the zero-dimensional region 142 becomes smaller to gradually raise the quantum level 143 in the region 142, so that the potential of the one-dimensional region 148 connected to the source electrode 140 becomes equal to the quantum level 143 in the zero-dimensional region 142 in terms of energy level. In this state, electrons can tunnel from the one-dimensional region 148 to the zero-dimensional region 142. However, they cannot tunnel from the zero-dimensional region 142 to the zero-dimensional region 144 because these zero-dimensional regions have different quantum levels.

Figure 15C:
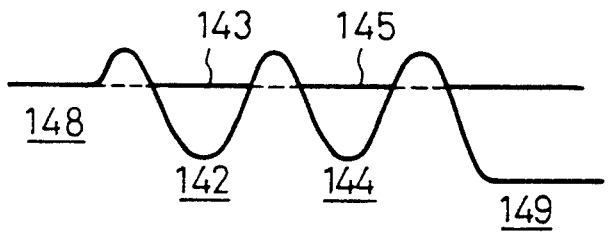

Next, an inverse bias voltage is applied to the gate electrode 160 to expand a depletion layer around the zero-dimensional region 144. As the depletion layer expands, the size of the zero-dimensional region 144 becomes smaller to gradually raise the quantum level 145 in the region 144. When the quantum level 145 becomes nearly equal to the quantum level 143 of the zero-dimensional region 142, a resonant tunneling phenomenon occurs. Namely, as shown in FIG. 15C, electrons at the quantum level 143 in the zero-dimensional region 142 are able to tunnel through an intermediate potential barrier toward the quantum level 145 of the zero-dimensional region 144.

Further, electrons in the one-dimensional region 148 can move to the quantum level 143 at the same energy level of the zero-dimensional region 142 by tunneling, and then to the quantum level 145 of the zero-dimensional region 144 by tunneling. Further, electrons at the quantum level 145 in the zero-dimensional region 144 are able to move to the one-dimensional region 149 by tunneling. As a result, a drain current flows.

Figure 15D:
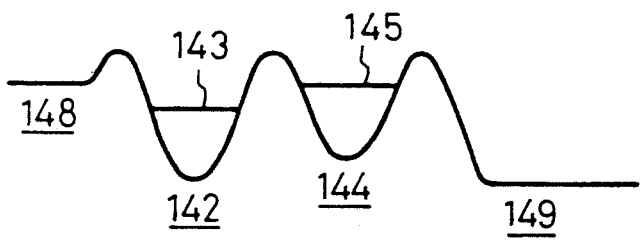
Figure 17A:
FIGS. 17A, 17B, and 17C are waveforms for explaining the operations of FIG. 16.
Figure 17B:
Figure 17C:
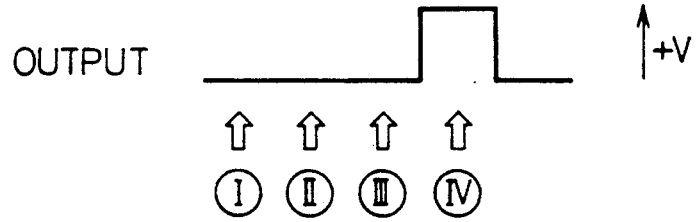

As shown in FIG. 15D, when the inverse bias voltage applied to the gate electrode 162 is decreased, the depletion layer around the zero-dimensional region 142 is reduced, so that the quantum level 143 in the zero-dimensional region 142 becomes small. Since the quantum level 143 shifts to a lower energy level than the quantum level 145, electrons cannot move, and thus the drain current drops.

FIG. 16 shows a table of the operations shown in FIGS. 15A to 15D, and FIGS. 17A, 17B, and 17C shows waveforms explaining the operations of FIG. 16.

In FIG. 16, reference f1 denotes a voltage applied to the gate electrode 162, and f2 denotes a voltage applied to the gate electrode 160. Further, in FIG. 16, reference "0" denotes the case when the gate or output voltage is at zero volts, "1" denotes the case when the gate voltage is at a specific inverse voltage to cause resonant tunneling or the case when the output voltage (drain voltage) is at a specific voltage corresponding to flowing a specific drain current.

As shown in FIGS. 16, 17A, 17B, and 17C, when both gate voltages f1 and f2 are at "0" (case I ) corresponding to the case of FIG. 15A, an output voltage is at zero volts, that is, no current is flown from the source electrode 140 to the drain electrode 146. When the gate voltage f1 is at "0" and the gate voltage f2 is at "1" (case II ) corresponding to the case of FIG. 15D, or when the gate voltage f1 is at "1" and the gate voltage f2 is at "0" (case III ) corresponding to the case of FIG. 15B, the output voltage is at zero volts, that is, no current is flown from the source electrode 140 to the drain electrode 146. When both gate voltages f1 and f2 are at "1" (case IV ) corresponding to the case of FIG. 15C, an output voltage is at a specific voltage, that is, a specific current is flown from the source electrode 140 to the drain electrode 146.

As described above, according to the fifth embodiment of the present invention, two gate electrodes 160 and 162 can be used to control the operation of the quantum semiconductor device. Note, the shapes of a peak and a valley on the I-V characteristics can be changed by effectively applying inverse bias voltages to two gate electrodes 160 and 162. Further, in the fifth embodiment, two zero-dimensional regions (quantum boxes) 142, 144, and two gate electrodes 160 and 162 are provided, but more than two of these zero-dimensional regions and gate electrodes can be provided.

Figure 18:
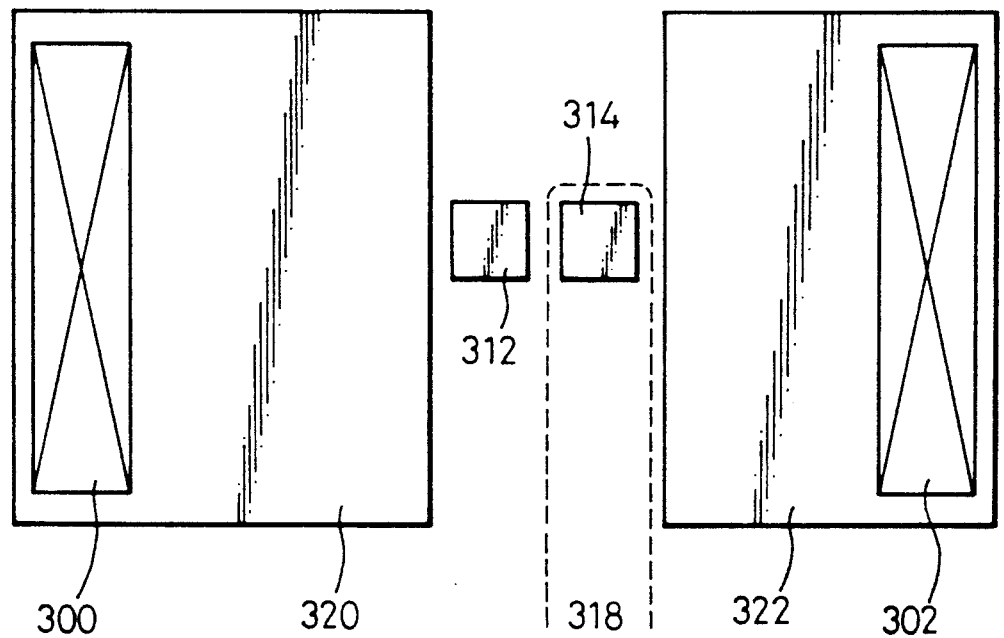
FIG. 18 is a plan diagram showing a sixth embodiment of a quantum semiconductor device according to the present invention.

FIG. 18 shows a sixth embodiment of a quantum semiconductor device according to the present invention. By comparing this sixth embodiment with the first embodiment shown in FIGS. 4A and 4B, in the sixth embodiment of FIG. 18, two-dimensional electron gas layers 320 and 322 are provided as the one-dimensional channels (source and drain regions) 18 and 19 of the first embodiment. The other configurations of the sixth embodiment are the same as that of the first embodiment. Namely, in FIG. 18, reference numerals 300 denotes a source electrode, 302 denotes a drain electrode, 312 and 314 denote zero-dimensional regions (quantum boxes), 318 denotes a gate electrode, and 320 and 322 denote two-dimensional electron gas layers (quantum well layers).

As clearly shown in FIG. 18, the one-dimensional channels 18 and 19 of the first embodiment can be formed by the two-dimensional electron gas layers 320 and 322. Further, the one-dimensional channels 18 and 19 of the first embodiment can be also formed by zero-dimensional regions (quantum boxes).

FIGS. 19A, 19B, and 19C show a basic configuration of a quantum semiconductor device according to the present invention. Namely, FIG. 19A shows potential diagrams of quantum states of a carrier emitter 407 and an adjacent carrier collector 408A (one of a plurality of carrier collectors). When the size of a quantum box is reduced, a potential distribution becomes gentler as shown in the figure and it never changes steeply.

FIG. 19A shows the carrier collector 408A with no external voltage applied to it. For the sake of simplicity of the figure, a quantum level 405 of the carrier emitter 407 is higher than a level 406A$a$ of the carrier collector 408A in terms of energy level. This, however, does not limit the invention.

In FIG. 19A, an arrow mark on the left side of the carrier emitter 407 denotes a source 402 for supplying carriers to the emitter 407. Another arrow mark on the right side of the carrier collector 408A is a drain 404A for draining carriers out of the collector 408A. In FIG. 19B, external voltage apply means such as an electrode applies a voltage to the carrier collector 408A, to expand a peripheral depletion layer region. As a result, the size of the quantum box is reduced in the direction of an arrow mark 1, and the quantum level 406A$b$ of the carrier collector 408A shifts toward a high-energy side. At the same time, the bottom of the potential rises.

When the quantum level of the carrier emitter 407 becomes equal to that of the carrier collector 408A in terms of energy, a resonant tunneling phenomenon occurs so that carriers injected from the source 402 to the carrier emitter 407 transit to the carrier collector 408A. At this time, if proper means makes the quantum level of the carrier collector 408A equal to that of the drain 404A, carriers flow from the source 402 to the drain 404A. If the drain 404A is not quantized, the carriers moved to the carrier collector 408A can flow, in a hot state, toward the drain 404A at once.

Since lattice vibration and other carrier diffusion mechanisms make a quantum level dull at a room temperature, a transition probability has a certain width. When the external voltage is further increased, the quantum level 406A$c$ of the carrier collector 408A becomes higher than the quantum level 405 of the carrier emitter 407 in terms of energy, to cause a non-resonant state. As a result, the carrier transition from the carrier emitter 407 to the carrier collector 408A is again stopped.

The level control of a quantum box according to the invention is realized by applying an external voltage to the quantum box, and is irrelevant to external potential around the quantum box. Namely, the control according to the invention is almost insensitive to charges of peripheral impurities, etc., unlike the conventional quantum boxes.

FIG. 19D shows a basic configuration of the quantum semiconductor device according to the present invention, that is, FIG. 19D shows an example of an arrangement of a plurality of carrier collectors according to the invention. (The figure shows three carrier collectors 408A, 408B, and 408C.) For the sake of explanation, the sizes of the carrier collectors are 408A < 408B < 408C, and a carrier is supposed to be an electron e.

The sizes of the carrier collectors 408A, 408B, and 408C are controlled as shown in FIGS. 19A, 19B, and 19C with no external voltage applied to them. When an external voltage is applied, a quantum level 406A of the carrier collector 408A, which is the highest among the carrier collectors in terms of energy in proportion to the quantum box size, will coincide with the quantum level 405 of the carrier emitter 407. As a result, electrons e injected from the source 402 to the carrier emitter 407 are injected into the carrier collector 408A by resonant tunneling.

When the external voltage is further increased, the carrier collector 408A will be in a non-resonant state, and instead, the carrier collector 408B, which has the next highest energy level, will be in a resonant state. As a result, electrons are injected from the quantum level 405 to a quantum level 406B by tunneling. When the external voltage is further increased, the carrier collector 408B is put in a non-resonant state, and a quantum level 406C of the carrier collector 408C, which has been in a non-resonant state so far, coincides with the carrier emitter level 405, to cause a resonant tunneling phenomenon.

In this way, carriers of one carrier emitter 407 can be switched to an optional one of a plurality of the conductive channels (formed by the carrier collectors and drains) at relatively sharp threshold values.

The principle explained with reference to FIGS. 19A, 19B, 19C, and 19D can be achieved by, for example, heterojunction modulation doping used for a high electron mobility transistor (HEMT), fine processing, and formation of proper electrodes. Namely, on or under a first semiconductor of low impurity concentration and narrow forbidden band width, a second semiconductor of high impurity concentration and wide forbidden band width is laminated, to form a modulation doping structure. A well layer is formed at a heterojunction interface of the first semiconductor by band bending, to collect electrons at the well layer. These electrons form a secondary electron gas, which may be surrounded and isolated by a depletion layer and put in a one- or zero-dimensional state. Under such a zero-dimensional state, the size of the quantum box is controlled as shown in FIGS. 19A to 19D. Namely, a resonant state is controlled without forming a special potential gradient outside the quantum box.

Figure 20A:
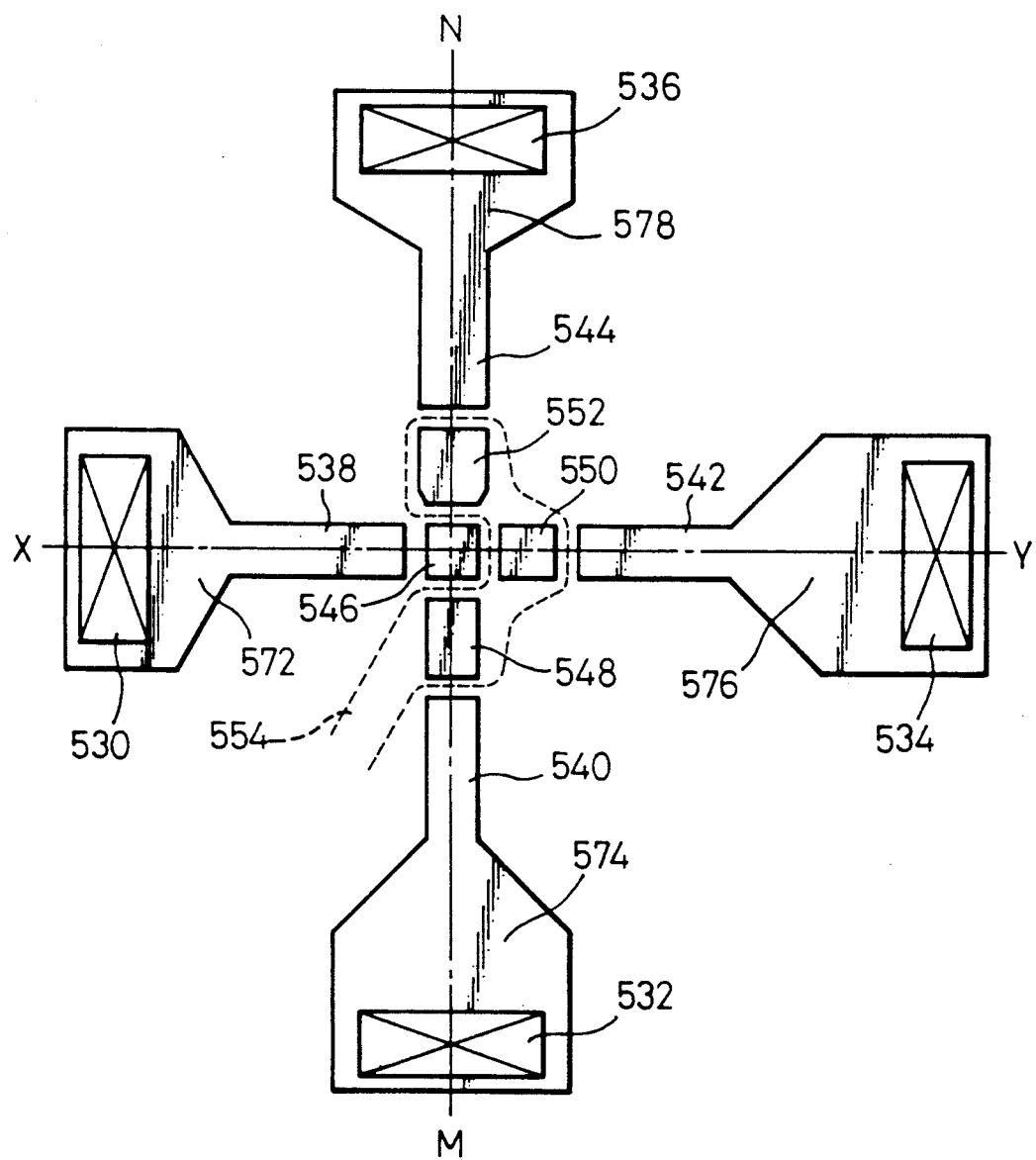
FIG. 20A is a plan diagram showing a seventh embodiment of a quantum semiconductor device according to the present invention.
Figure 20B:
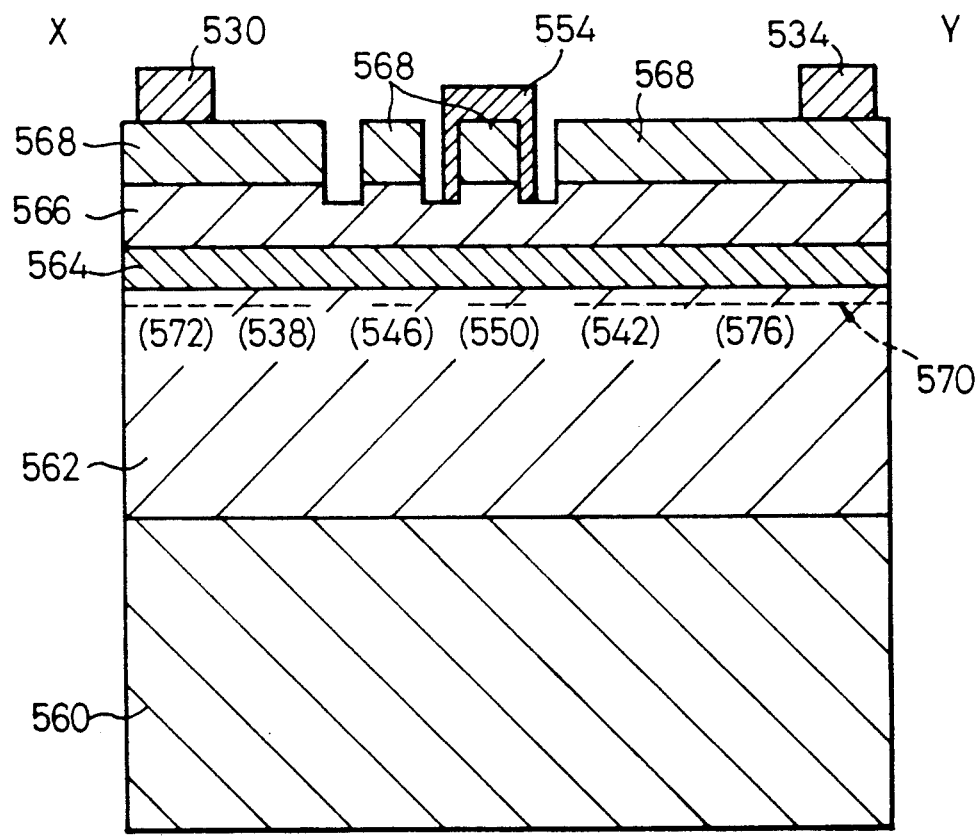
FIG. 20B and 20C are sectional diagrams of the seventh embodiment shown in FIG. 20A.
Figure 20C:
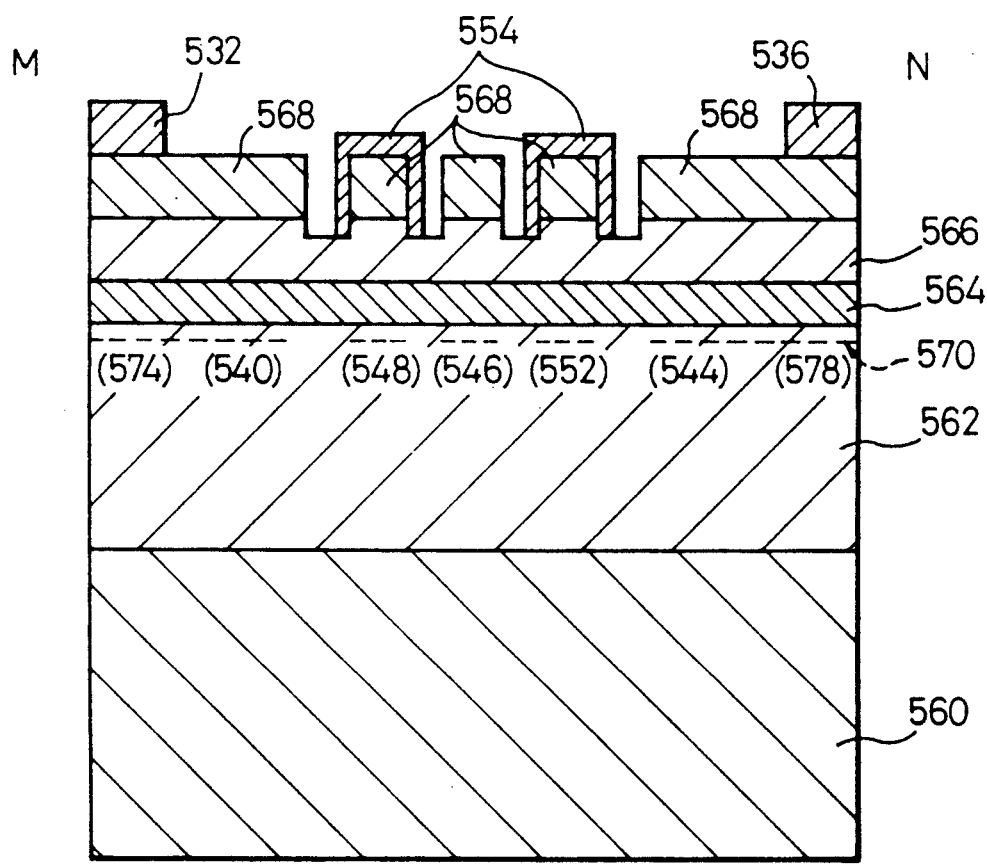

FIGS. 20A, 20B, and 20C show a seventh embodiment of a quantum semiconductor device according to the present invention. FIG. 20A shows a functional layer region of a multichannel quantum box semiconductor device (quantum semiconductor device), FIG. 20B shows an X-Y cross section of FIG. 20A, and FIG. 20C shows an M-N cross section of FIG. 20A.

Similar to FIG. 19D, FIG. 20A shows a quantum box carrier emitter 546 and quantum carrier collectors 548, 550, and 552 arranged adjacent to the carrier emitter. These carrier collectors have different sizes (the sizes being in the order of 550<548<552). Each emitter-collector gap is several to ten odd nanometers (nm) to allow tunneling injection even when the sizes of the collectors are reduced by a depletion layer. The sizes of the emitter and collectors are several tens of nanometers each.

A source 538 is disposed adjacent to the carrier emitter 546, and drains 540, 542, and 544 are arranged adjacent to the collectors 548, 550, and 552, respectively. In FIG. 20A, each drain region has a one-dimensional channel (quantum thin line) structure. It is not necessary to always quantize the drain regions. The quantum level of each of the drains 540, 542, and 544 is controlled by a corresponding gate electrode (not shown), so that the quantum level may coincide with that of corresponding one of the carrier collectors 548, 550, and 552. Further, in the case that the drains 540, 542, and 544 are not quantized, the gate electrodes cannot be provided.

The source 538 is connected to a two-dimensional electron gas region 572. A source electrode 530 is disposed on the region 572. The drains 540, 542, and 544 are connected to two-dimensional electron gas regions 574, 576, and 578, respectively. Drain electrodes 532, 534, and 536 are disposed on the respective regions. A common gate electrode 554 is disposed over the carrier collectors 548, 550, and 552.

Processes of fabricating the above structure will now be explained. As shown in FIGS. 20B and 20C, a semi-insulating GaAs substrate 560, an undoped GaAs layer 562 of 500 nm thick, an undoped AlGaAs spacer layer 564 of 10 nm thick, an n-type AlGaAs electron supply layer 566 of 45 nm thick and $1 \times 10^{18}$ cm$^{-3}$ in impurity concentration, and an n+-type GaAs contact layer 568 of $1 \times 10^{18}$ cm$^3$ in carrier concentration are formed one upon another. These layers are successively formed by an MBE method in a multilayer structure.

Next, on the n+-type GaAs contact layer 568, a source electrode 530 and drain electrodes 532, 534, and 536 of AuGe/Au (20 nm/200 nm in thickness) are formed by vapor deposition and by a standard lift-off method. Thereafter, the electrodes are heat-treated to make alloys. The alloyed regions reach to the depth of a two-dimensional electron gas layer 570. Namely, the source electrode 530 and drain electrodes 532, 534, and 536 are electrically connected to the two-dimensional electron gas layer 570 through the alloy regions.

The undoped GaAs channel layer 562 and n-type AlGaAs electron supply layer 566 form a modulation dope heterojunction. The two-dimensional electron gas layer 570 is formed at a heterojunction interface region of the undoped GaAs channel layer 562 and provides a sheet carrier concentration of about $2.3 \times 10^{11}$ cm$^{-2}$ and an electron mobility of about 800,000 cm$^2$/V sec.

To form a carrier emitter 546 and carrier collectors 548, 550, and 552 on the two-dimensional electron gas layer 570 as shown in FIGS. 20B and 20C, a selective dry etching technique is used to recess part of the n+-type GaAs contact layer 568 and n-type AlGaAs electron supply layer 566, thereby separating regions for the source, carrier emitters, carrier collectors, and drains. In the undoped GaAs channel layer 562 just below the etched regions, the two-dimensional electron gas layer 570 disappears from the heterojunction interface region due to the formation of a depletion layer.

Finally, to control the sizes of the quantum boxes of the carrier collectors 548, 550, and 552 by an external voltage, a Schottky gate electrode 554 made of an Al film of 300 nm thick is deposited over a corresponding region of the contact layer 568. As indicated with a dotted line in FIG. 20A, the electrode 554 is continuously formed to control all of the carrier collectors 548, 550, and 552.

In FIGS. 20B and 20C, the Schottky gate electrode 554 is made of an Al film that is deposited not only over the surface of the island-like region of the contact layer, but also on the side faces thereof.

FIGS. 21A and 21B show a modified Schottky gate electrode 554 of the quantum semiconductor device shown in FIGS. 20A to 20C. In this case, an Al (aluminium) film is not deposited over the top face of the island-like region of the contact layer 568 but only on the side faces thereof.

When a voltage is applied to the electrode 554 to reduce the size of the quantum box, a quantum level shifting rate will be larger than a carrier collector shrinking rate in the electrode 554 that is formed only on the side faces of the island-like region, compared with that formed entirely over the island-like region, thereby providing an advantage that an output rises and falls more steeply in response to a change in the gate voltage. Another advantage is that multichannel outputs through a plurality of the carrier collectors are more clearly separated.

The quantum box sizes of the carrier collectors 548, 550, and 552 thus formed according to the seventh embodiment are set as follows:

Collector 550 < Collector 548 < Collector 552

Namely, among the quantum levels of the carrier collectors with no external voltage being applied to them, that of the collector 552 is the lowest in terms of energy, the next lowest is that of the collector 548, and then that of the collector 550.

For the sake of simplicity, the size of the carrier emitter 546 is supposed to be smaller than that of the carrier collector 550. In this case, the quantum level of the carrier emitter 546 is the highest in terms of energy among the quantum boxes. The size of the carrier emitter may naturally be larger than or equal to any one of those of the other quantum boxes. This is done only by shifting quantum level energy relative to a voltage applied to the gate electrode 554, and does not basically influence the operation of the semiconductor device.

The quantum levels of the quantum thin line regions 538, 540, 542, and 544, which are formed adjacent to one another so that tunneling injection is carried out in the quantum box regions 546, 548, 550, and 552, are lower than the levels of the quantum boxes in terms of energy.

FIGS. 22A, 22B, and 22C show potential states of the respective regions with no voltage being applied to the gate electrode 554. The quantum level 547 of the carrier emitter 546 is higher than the quantum level 551 of the carrier collector 550 in terms of energy. The quantum level 549 of the carrier collector 548 is lower than the quantum level 551. The quantum level 553 of the carrier collector 552 is further lower than the quantum level 549.

When a negative voltage is applied to the source electrode 530 to increase the quantum level of the source 538 up to the quantum level 547 of the carrier emitter 546, resonant tunneling occurs to inject electrons into the carrier emitter 546. A negative voltage is also applied to the drain electrode 534 to equalize the quantum level of the drain 542 with the quantum level 551 of the carrier collector 550. Since the quantum level 551 is lower than the quantum level 547 in terms of energy, no drain current flows.

Figure 23A:
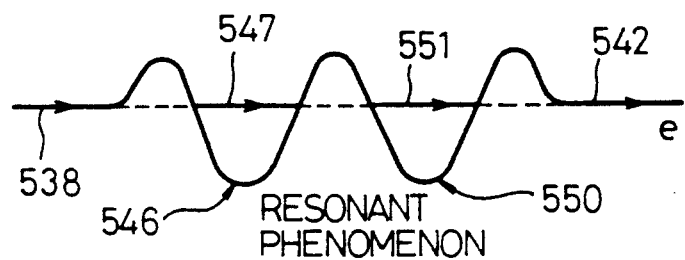

Next, a negative voltage is applied to the Schottky gate electrode 554 to increase the quantum levels of the respective collectors in terms of energy. Firstly, the quantum level 551 of the carrier collector 550 coincides with the quantum level 547 of the carrier emitter 546 to cause a resonant state. As a result, electrons transit from the carrier emitter to the carrier collector. Since the quantum level 551 and the quantum level of the drain 542 are equal to each other, the electrons tunneled and injected to the quantum level 551 immediately flow to the drain 542 due to resonant tunneling, thereby producing a drain current. Note, in this case, the energy level of the source 538 is specified as a little higher than that of the drain 542. This state is shown in FIGS. 23A to 23C.

Figure 23B:
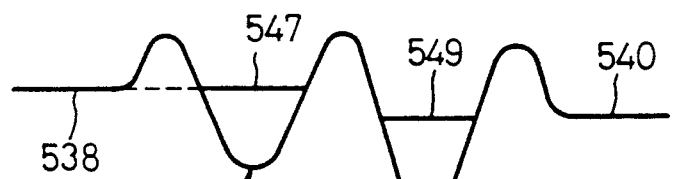
Figure 23C:
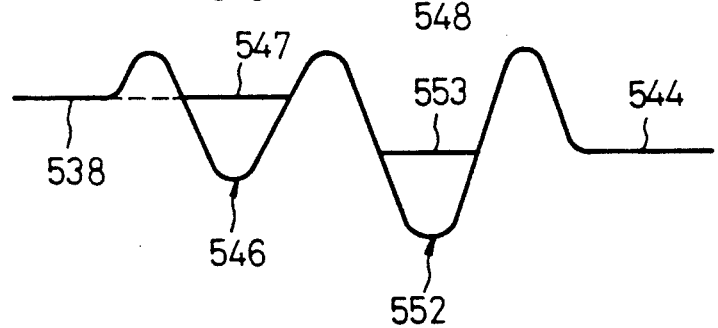

As shown in FIGS. 23B and 23C, the quantum levels of the other carrier collectors are still lower than the quantum level 547 of the carrier emitter 546 in terms of energy, so that no drain current flows to them. The quantum levels of the drains 540 and 544 are equalized to the quantum levels 549 and 553 of the carrier collectors 548 and 552. As the bias of the Schottky gate electrode 554 is gradually deepened, the quantum levels of the carrier collectors rise. As a result, a current flows to the drain 540 of the carrier collector 548, then to the drain 544 of the carrier collector 552. When a drain current flows through one of the carrier collectors, the other drain currents are substantially zeroed.

Figure 24:
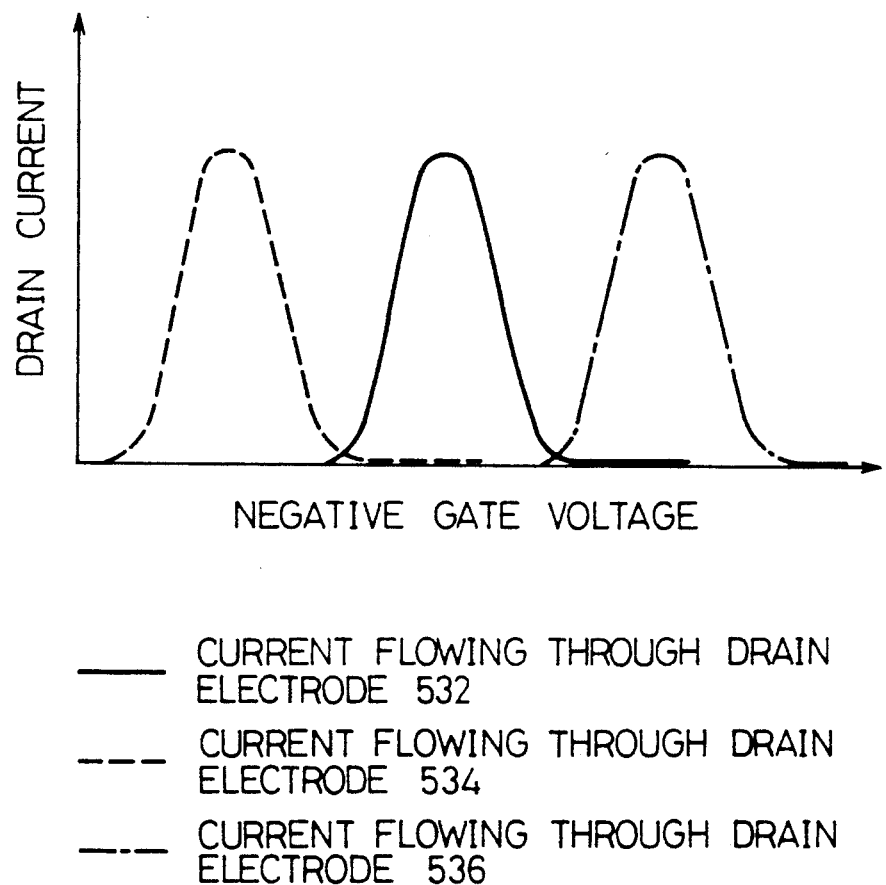
FIG. 24 is a diagram showing I-V characteristics of the seventh embodiment shown in FIGS. 20A and 20B.

FIG. 24 shows I-V characteristics of the seventh embodiment shown in FIGS. 20A and 20B, that is, FIG. 24 shows relationships between the drain currents and the Schottky gate voltage. In FIG. 24, a broken line indicates a current flowing through the drain electrode 534, a solid line indicates a current flowing through the drain electrode 532, and a dashed line denotes a current flowing through the drain electrode 536, respectively. The drain currents are not completely zeroed due to lattice vibration, transition between sub-levels, etc., under a room temperature. Namely, it is difficult to sharply cut off the currents. It is possible, however, to speedily switch over channels for flowing currents from one to another only by changing the magnitude of the gate voltage.

In the above seventh embodiment, three systems of channels are arranged around the carrier emitter 546. The number of the channels can be increased or decreased as and when required. The quantum boxes can be formed not only by etching as mentioned above but also by ion implantation. Further, in the seventh embodiment, the two-dimensional electron gas layer 570 is formed by modulation doping of AlGaAs/GaAs. It is possible to employ combinations of other materials such as InAlAs/InGaAs. The source 538 and drains 540, 542, and 544 may have a quantum well structure or may not be quantized. Furthermore, in the above seventh embodiment, carriers tunneled are electrons. However, the invention may instead employ positive holes.

Figure 25:
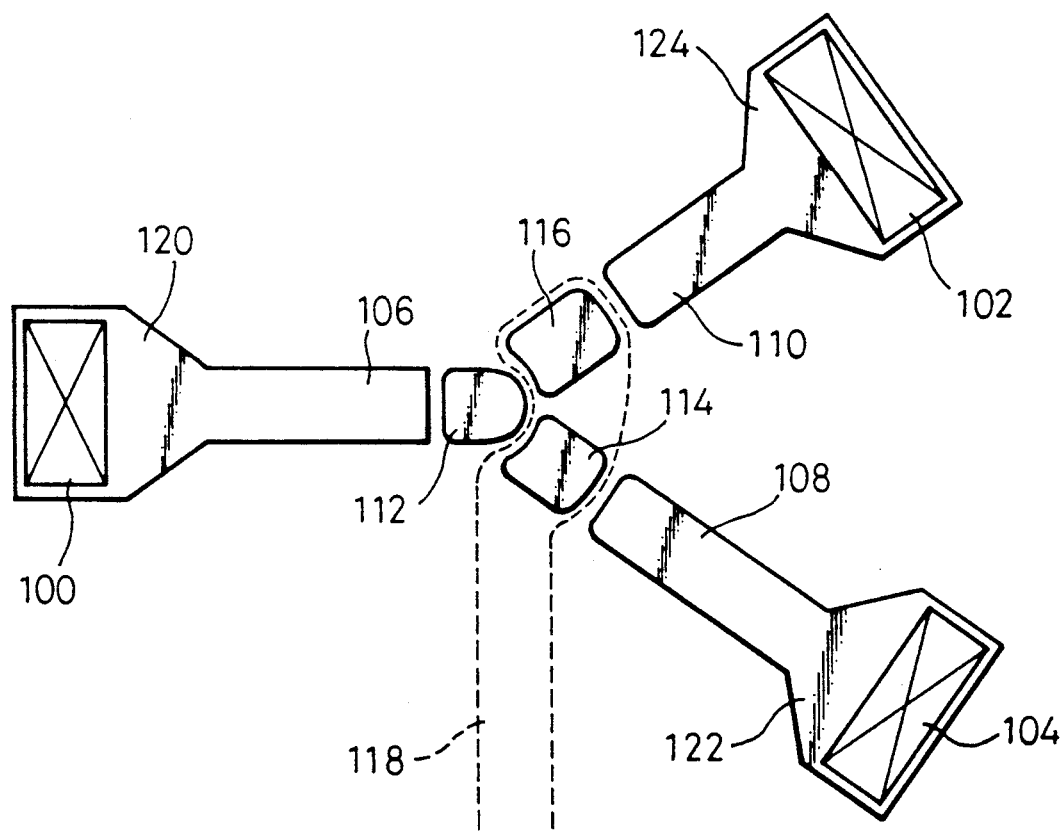
FIG. 25 is a plan diagram showing an eighth embodiment of a quantum semiconductor device according to the present invention.

FIG. 25 shows an eighth embodiment of a quantum semiconductor device according to the present invention. Note, in this eighth embodiment, two carrier collectors 114 and 116 (drains 108 and 110) are provided, however, in the seventh embodiment shown in FIGS. 20A to 24, three carrier collectors 548, 550, and 552 (drains 540, 542, and 544) are provided. Further, in this eighth embodiment, one Schottky gate electrode 118 is provided to control the quantum levels of the respective carrier collectors 114 and 116, which is the same as that of the seventh embodiment.

Namely, for example, this eighth embodiment is the same configuration of that deleting the carrier collector 548, drain 540, two-dimensional electron gas region 574, and drain electrode 532 from the seventh embodiment. Concretely, in FIG. 25, reference numerals 100, 120, 106, 112, 114, 116, and 118 denote the same portions of the seventh embodiment indicated by the reference numerals 530, 572, 538, 546, 550, 552, and 554 shown in FIG. 20A. Further, in FIG. 25, reference numerals 108, 122, 104, 110, 124, and 102 denote the same portions of the seventh embodiment indicated by the reference numerals 542, 576, 534, 544, 578, and 536 shown in FIG. 20A.

As described above, the number of the carrier collectors (548, 550, 552; 114, 116), drains (540, 542, 544; 108, 110), two-dimensional electron gas regions (574, 576, 578; 12, 124), and drain electrodes (532, 534, 536; 104, 102) is determined to three or two, but the number thereof can be determined as more (four, five, . . . ).

Figure 26:
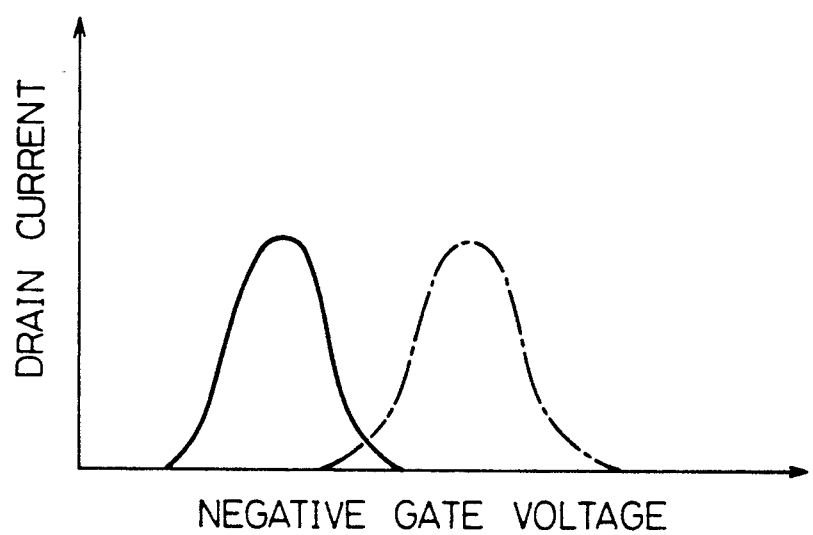
FIG. 26 is a diagram showing I-V characteristics of the eighth embodiment shown in FIG. 25.

FIG. 26 shows I-V characteristics of the eighth embodiment shown in FIG. 25, which corresponds to the solid and dashed lines shown in FIG. 24. In FIG. 26, a solid line indicates a current flowing through the drain electrode 104, and dashed line denotes a current flowing through the drain electrode 102.

Figure 27:
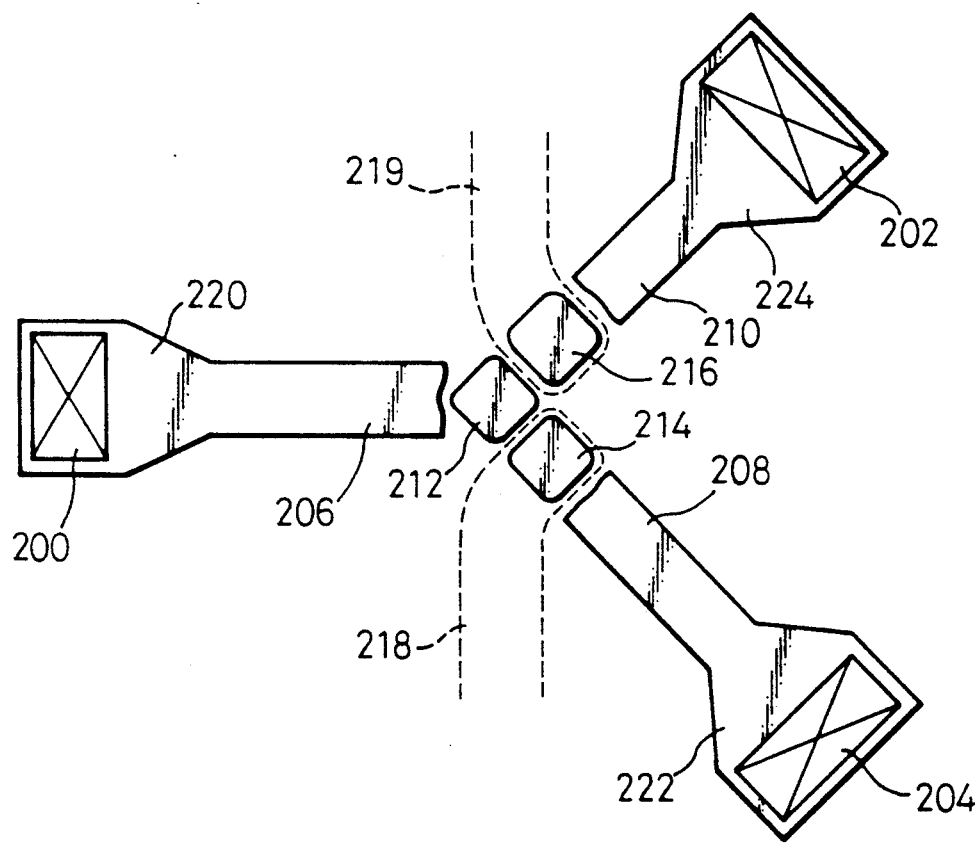
FIG. 27 is a plan diagram showing a ninth embodiment of a quantum semiconductor device according to the present invention.

FIG. 27 shows a ninth embodiment of a quantum semiconductor device according to the present invention. Note, in this ninth embodiment, two Schottky gate electrodes 218 and 219 are provided instead of one Schottky gate electrode 118 of the eighth embodiment shown in FIG. 25. In FIG. 27, reference numerals 200, 220, 206, 212, 214, and 216 denote the same portions of the eighth embodiment indicated by the reference numerals 100, 120, 106, 112, 114, and 116 shown in FIG. 25. Further, in FIG. 27, reference numerals 208, 222, 204, 210, 224, and 202 denote the same portions of the eighth embodiment indicated by the reference numerals 108, 122, 104, 110, 124, and 102 shown in FIG. 25.

Namely, in this ninth embodiment, the gate electrode 218 is provided to control the quantum level of the carrier collector 214, the gate electrode 219 is provided to control the quantum level of the carrier collector 216, and thus the quantum levels of the carrier collectors 214 and 216 are independently controlled by the gate electrodes 218 and 219.

Figure 28A:
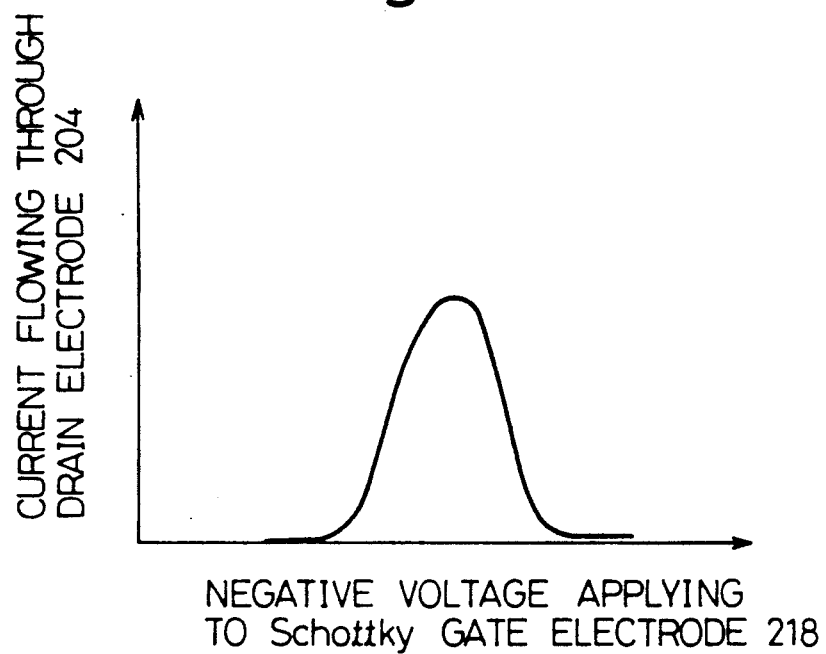
FIGS. 28A and 28B are diagrams showing I-V characteristics of the ninth embodiment shown in FIG. 27.
Figure 28B:
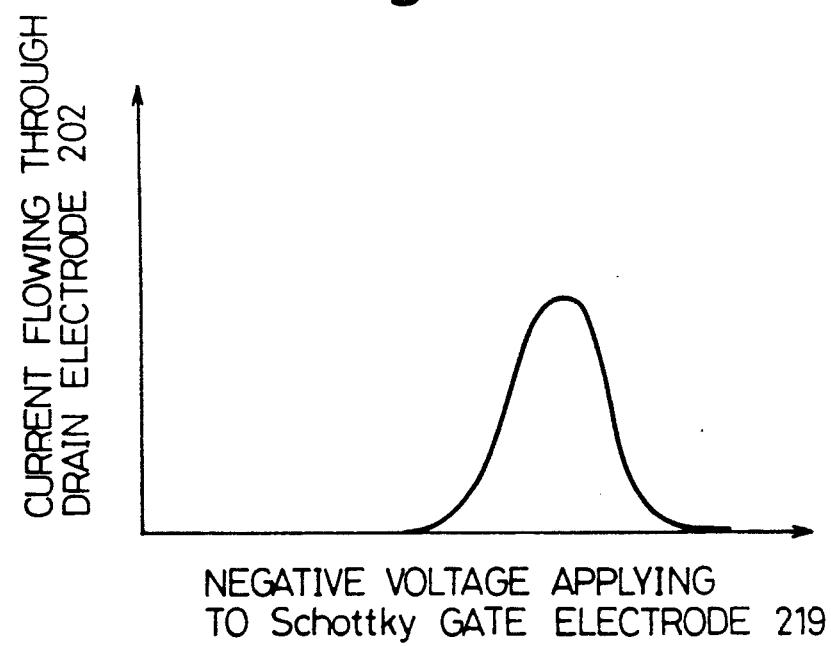

FIGS. 28A and 28B show I-V characteristics of the ninth embodiment shown in FIG. 27, which corresponds to that shown in FIG. 26. Namely, the I-V characteristics shown in FIG. 28A, which depicts a current flowing through he drain electrode 204, corresponds to the solid line shown in FIG. 26, and the I-V characteristics shown in FIG. 28B, which depicts a current flowing through he drain electrode 202, corresponds to the dashed line shown in FIG. 26, respectively. As described above, the gate electrodes can be separately formed to independently control the quantum level of the carrier collectors.

Figure 29:
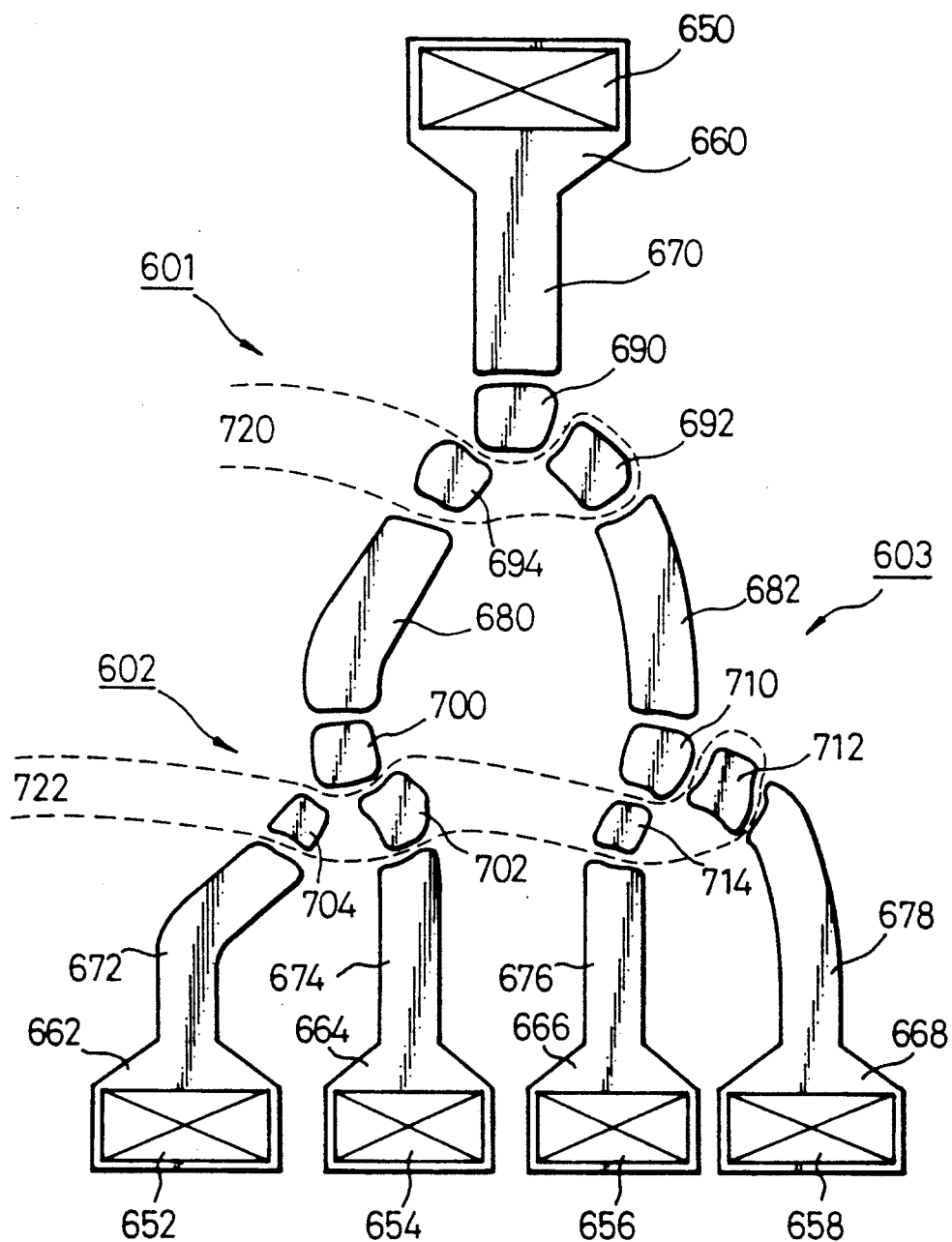
FIG. 29 is a plan diagram showing an example of a decoder using a plurality of quantum semiconductor devices according to the present invention.

FIG. 29 shows an example of a decoder using a plurality of quantum semiconductor devices according to the present invention. In FIG. 29, reference numerals 650 denotes a source electrode, 652, 654, 656 and 658 denote drain electrodes, 690, 700 and 710 denote carrier emitters, 694, 692, 704, 702, 714 and 712 denote carrier collectors, and 720 and 722 denote Schottky gate electrodes. Further, in FIG. 29, reference numerals 670 denotes a source, 672, 674, 676 and 678 denote drains, and 660, 662, 664, 666 and 668 denote two-dimensional electron gas regions.

As shown in FIG. 29, the decoder, which is a two-input (720, 722)/four-output (652, 654, 656, 658) decoder of two-stage configuration, is constituted by three quantum semiconductor devices 601, 602, and 603 shown in FIG. 25. Note, a drain of the first quantum semiconductor device 601 and a source of the second quantum semiconductor device 602 are commonly formed as an intermediate carrier channel 680, a drain of the first quantum semiconductor device 601 and a source of the third quantum semiconductor device 603 are commonly formed as an intermediate carrier channel 682, and thus drain electrodes of the second device and source electrodes of the second and third devices, and the like are deleted therefrom. Further, as shown in FIG. 29, the quantum levels of the carrier collectors 694 and 692 are controlled by the Schottky gate electrode 720, and the quantum levels of the carrier collectors 704, 702, 714 and 712 are controlled by the Schottky gate electrode 722. Furthermore the sizes of the carrier collectors 694, 704 and 714 are smaller than those of the carrier collectors 692, 702 and 712, respectively.

FIG. 30 shows a table of the operations of the decoder shown in FIG. 29. In FIG. 30, reference F1 denotes a voltage applied to the gate electrode 720, F2 denotes a voltage applied to the gate electrode 722, and OUT1, OUT2, OUT3 and OUT4 denote voltages appeared at the drain electrodes 652, 654, 656 and 658. Further, in FIG. 30, reference "0" denotes the case when the gate or output voltage is at zero volts, "1" denotes the case when the gate voltage is at a specific inverse voltage to cause resonant tunneling or the case when the output voltage is at a specific voltage corresponding to flowing a specific drain current.

As shown in FIG. 30, when both gate voltages F1 and F2 are at "0" (case V), an output voltage of the OUT1 is at a specific voltage ("1"), that is, a specific current is flown from the source electrode 650 to the drain electrode 652, and the other output voltages of the OUT2, OUT3 and OUT4 are at zero volts. When a gate voltage F1 is at "0" and a gate voltage F2 is at "1" (case VI), an output voltage of the OUT2 is at a specific voltage ("1"), that is, a specific current is flown from the source electrode 650 to the drain electrode 654, and the other output voltages of the OUT1, OUT3 and OUT4 are at zero volts. When a gate voltage F1 is at "1" and a gate voltage F2 is at "0" (case VII), an output voltage of the OUT3 is at a specific voltage ("1"), that is, a specific current is flown from the source electrode 650 to the drain electrode 656, and the other output voltages of the OUT1, OUT2 and OUT4 are at zero volts. When both gate voltages F1 and F2 are at "1" (case VIII), an output voltage of the OUT4 is at a specific voltage ("1"), that is, a specific current is flown from the source electrode 650 to the drain electrode 658, and the other output voltages of the OUT1, OUT2 and OUT3 are at zero volts.

In the above descriptions with reference to FIGS. 29 and 30, a decoder can be constituted by using a plurality of quantum semiconductor devices (multichannel quantum box semiconductor devices) according to the present invention. Further, this sort of quantum semiconductor device is properly applicable for a highly integrated device such as a neural network, and the like.

As explained above, the effective size of a quantum box is changed to control a quantum level in the quantum box, and the sizes of quantum boxes of multichannel carrier collectors are effectively changed in response to an external voltage to change quantum levels in the quantum boxes. Namely, a resonant tunneling phenomenon (resonant tunneling) is controlled by changing the quantum level in the quantum box, or by changing the size of the quantum box, so that the periphery of the quantum box is not so affected by potential. Further, the quantum levels of the respective carrier collectors are properly changed in response to the voltage to optionally select a channel that selectively produces a current flow by a resonant tunneling phenomenon.

Consequently, according to the present invention, since the quantum levels are controlled by changing the sizes of the quantum boxes, an influence of charges due to peripheral impurities is small, and thereby a compact quantum semiconductor device can be provided. Further, according to the present invention, a highly integrated high-speed switching circuit can be provided.

Many widely differing embodiments of the present invention may be constructed without departing from the spirit and scope of the present invention, and it should be understood that the present invention is not limited to the specific embodiments described in this specification, except as defined in the appended claims.

I claim:

1. A quantum semiconductor device comprising:
   a semiconductor substrate;
   a carrier emitter having a quantum box structure formed in said semiconductor substrate;
   a plurality of carrier collectors each having a quantum box structure formed in said semiconductor subject, so that carriers tunnel from said carrier emitter to said carrier collectors wherein said carrier collectors are formed by quantum boxes of different sizes; and
   control means for controlling the sizes of said carrier collectors by an external voltage, said control means has an external voltage applying means for applying the same external voltage to said carrier collectors, and said carrier emitter separately provides carriers, by resonant tunneling, to said carrier collectors in response to said external voltage.

2. A quantum semiconductor device as claimed in claim 1, wherein said quantum semiconductor device further comprises a source means having one of a two-dimensional electron gas structure and a one-dimensional carrier gas for supplying carriers to said carrier emitter, and a plurality of drain means each having one of a two-dimensional electron gas structure and a one-dimensional carrier gas for receiving carriers from said carrier collectors.

3. A quantum semiconductor device as claimed in claim 2, wherein said source means, said carrier emitter, said carrier collectors, and drain means are formed in a two-dimensional electron gas region produced by a heterojunction modulation dope.

4. A quantum semiconductor device as claimed in claim 1, wherein said control means includes one Schottky electrode connected to all of said carrier collectors.

5. A quantum semiconductor device as claimed in claim 4, wherein a number of said carrier collectors are determined to be three, and said Schottky electrode is connected to said three carrier collectors.

6. A quantum semiconductor device as claimed in claim 4, wherein a number of said carrier, collectors are determined to be two, and said Schottky electrode is connected to said two carrier collectors.

7. A quantum semiconductor device as claimed in claim 1, wherein said control means includes a plurality of Schottky electrodes each connected to a corresponding one of said carrier collectors.

8. A quantum semiconductor device as claimed in claim 4, wherein a number of said carrier collectors are determined to be two, and each of said Schottky electrodes are connected to a corresponding one of said two carrier collectors.

9. A quantum semiconductor device as claimed in claim 1, wherein a plurality of said quantum semiconductor devices are combined to constitute a decoder.

* * * * *